United States Patent
Wang et al.

(10) Patent No.: US 7,132,174 B2
(45) Date of Patent: Nov. 7, 2006

(54) COPOLYMERS HAVING TUNABLE ENERGY LEVELS AND COLOR OF EMISSION

(75) Inventors: Hailiang Wang, Camarillo, CA (US); Gang Yu, Santa Barbara, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/446,752

(22) Filed: May 27, 2003

(65) Prior Publication Data

US 2004/0038075 A1 Feb. 26, 2004

Related U.S. Application Data

(60) Provisional application No. 60/384,494, filed on May 31, 2002.

(51) Int. Cl.
*H05B 33/14* (2006.01)
*C09K 11/06* (2006.01)

(52) U.S. Cl. ............. 428/690; 428/917; 313/504; 257/40; 252/301.25

(58) Field of Classification Search ......... 428/690, 428/917; 528/101; 313/504, 506; 257/40; 252/301.16; 435/320.1, 325, 69.1
See application file for complete search history.

(56) References Cited

U.S. PATENT DOCUMENTS

| | | | |
|---|---|---|---|
| 5,470,505 A | 11/1995 | Smith et al. | |
| 5,621,131 A | 4/1997 | Kreuder et al. | |
| 5,723,873 A | 3/1998 | Yang | |
| 5,869,350 A | 2/1999 | Heeger et al. | |
| 5,998,045 A * | 12/1999 | Chen et al. | 428/690 |
| 6,124,046 A | 9/2000 | Jin et al. | |
| 6,399,224 B1 * | 6/2002 | Li | 428/690 |
| 6,630,254 B1 * | 10/2003 | Leclerc et al. | 428/690 |
| 2002/0045719 A1 * | 4/2002 | Hawker et al. | 526/171 |

FOREIGN PATENT DOCUMENTS

| | | |
|---|---|---|
| DE | 198 46 767 A1 | 4/2000 |
| WO | WO 99/54385 | 10/1999 |
| WO | WO 01/42331 A1 | 6/2001 |
| WO | WO 01/77203 A2 | 10/2001 |

OTHER PUBLICATIONS

Segura, J. L., The chemistry of electroluminescent organic materials, Acta Polym., 1998, 319-344, 49, Wiley-VCH Verlag GmbH, Weinheim.

Yu, Wang-Lin et al., Tuning Redox Behavior and Emissive Wavelength of Conjugated Polymers by p-n Diblock Stuctures, J. Am. Chem. Soc., 1998, 11808-11809, 120, American Chemical Society.

Hadziioannou, Georges, Opto-Electronic Devices From Block Copolymers and Their Oligomers, ANTEC 1997, 1254-1258.

(Continued)

*Primary Examiner*—Rena Dye
*Assistant Examiner*—Carnie S. Thompson

(57) ABSTRACT

Different formulations of copolymers can be used to adjust or "tune" the energy levels (HOMO and LUMO) and the color of light emitted by an organic electronic device. The copolymer may principally include of electron-rich and electron-deficient monomeric units whose composition and number are chose to optimize the efficiency of the device. A relatively smaller amount of fluorophore monomeric units may also be used to adjust the emission wavelength. The copolymer can be used in displays and potentially other electronic devices.

9 Claims, 5 Drawing Sheets

OTHER PUBLICATIONS

Brazovskil, S. A. et al., Excitons, polarons, and bipolarons in conducting polymers, JETP Lett, Jan. 5, 1981, 4-8, vol. 33, No. 1, American Institute of Physics.

Fesser, K., Optical absorption from polarons in a model of polyacetylene, Physical Review B, Apr. 15, 1983, 4804-4825, vol. 27, No. 8, The American Chemical Society.

Hagler, T. W. et al., Enhanced order and electronic delocalization in conjugated polymers orinted by gel processing in polyethylene, Physical Review B, Oct. 15, 1991, vol. 44, No. 16, The American Chemical Society.

Bradley, D D C et al., Light-induced luminescense quenching in precursor-route poly(p-phenylene vinylene), J. Phys.: Condens. Matter, 1989, 3671-3678, 1, IOP Publishing Ltd.

Parker, I. D., Carrier tunneling and device characteristics in polymer light-emitting diodes, J. Appl. Phys., Feb. 1, 1994, 1656-1666, 75 (3), American Institute of Physics.

Gong, Yong et al., A Convenient Synthesis of Heteroaryl Benzoic Acids via Suzuki Reaction, Synlett 2000, 829-831, No. 6, Thieme Stuttgart, New York.

Ueda, Mitsuru et al., Synthesis of Poly(2,5-dialkoxyphenylene), Macromolecules, 1992, 5125-5130, 25, American Chemical Society.

Ebert, Greg W. et al., Preparation of Aryl, Alkynyl, and Vinyl Organocopper Compounds by the Oxidative Addition of Zerovalent Copper to Carbon-Halogen Bonds, J. Org. Chem., 1988, 4482-4488, 53, American Chemical Society.

Matsumoto, Hideyuki et al., Activated Metallic Nickel as a Reagent for the Dehalogenative Coupling of Halobenzenes, J. Org. Chem., 1983, 840-843, 49, American Chemical Society.

Miyaura, N. et al., The Palladium-Catalyzed Cross-Coupling Reaction of Phenylboronic Acid With Haloarenes in the Presence of Bases, Synthetic Communications, 1981, 513-519, 11(7), Marcel Dekker, Inc.

Miller, R. Bryan et al., Stoichiometric Synthesis of Unsymmetrical Mononitrobiphenyls via the Palladium-Catalyzed Cross-Coupling of Arylbornic Acids with Aryl Bromides, Organometallics, 1984, 1261-1263, 3, American Chemical Society.

De Leeuw, D. M. et al., Stability of n-type doped conducting polymers and consequences for polymeric microelectronic devices, Synthetic Metals, 1997, 53-59, 87, Elsevier Science S.A.

Grimsdale, Andrew C. et al., Model Compounds for Novel High Electron Affinity Polymers, Synthetic Metals, 1997, 1257-1258, 85, Elsevier Science S.A.

Li, Yongfang et al., Electrochemical properties of luminescent polymers and polymer light-emitting electrochemical cells, Synthetic Metals, 1999, 243-248, 99, Elsevier Science S.A.

Burroughes, J. H. et al., Light-emitting diodes based on conjugated polymers, Nature, Oct. 11, 1990, 839-541, vol. 11.

Braun, D. et al., Visible light emission from semiconducting polymer diodes, Appl. Phys. Lett., May 6, 1991, 1982-1984, 58(18), American Institute of Physics.

Gustafsson, G. et al., Flexible light-emitting diodes made from soluble conducting polymers, Nature, Jun. 11, 1992, 477-479.

Yang Y. et al., Polyaniline as a transparent electrode for polymer light-emitting diodes: Lower operating voltage and higher efficiency, Appl. Phys. Lett., Mar. 7, 1994, 1245-1247, 64(10), American Institute of Physics.

Yang Y. et al., Enhanced performance of polymer light-emitting diodes using high-surface area polyaniline network electrodes, J. Appl. Phys., Jan. 15, 1995, 694-698, 77(2), American Institute of Physics.

Gao, J. et al., Soluble polypyrrole as the transparent anode in polymer light-emitting diodes, Synthetic Metals, 1996, 221-223, 82, Elsevier Science S.A.

Diaz-Garcia, Maria A., "Plastic" lasers: Comparison of gain narrowing with a soluble semiconducting polymer in waveguides and microcavities, Appl. Phys. Lett., Jun. 16, 1997, 3191-3193, 70(24), American Institute of Physics.

Kovacic, Peter et al., Dehydro Coupling of Aromatic Nuclei by Catalyst-Oxidant Systems: Poly(p-phenylene), Chem. Rev., 1987, 357-379, 87, American Chemical Society.

* cited by examiner

COPOLYMERS HAVING TUNABLE ENERGY LEVELS AND COLOR OF EMISSION

BACKGROUND OF THE INVENTION

1. Field of the Invention

The invention relates in general to copolymers for which the energy levels (HOMO and LUMO) and color of emission can be adjusted or tuned by choosing a proper composition, and electronic devices in which the active layer includes such polymeric materials.

2. Description of the Related Art

The use of organic light-emitting displays is increasing as a replacement to liquid crystal displays (LCD) and thin-film transistor (TFT) displays in many applications. Patents and articles address ways to maximize the quantum efficiency of the OLED as well as to change the color of the light emitted from organic light-emitting diodes (OLEDs).

Balanced carrier injection from both the cathode and anode can increase the quantum efficiency of the LED device. Carrier injection can be sensitive to the height of the barriers in the interface between an electrode and the polymer in an organic LED. The energy levels of a conjugated polymer, which are the highest occupied molecular orbital ("HOMO") and lowest unoccupied molecular orbital ("LUMO"), may be tuned so that a substantially balanced and nearly maximum amount of the carriers can be injected from the electrodes.

In some references, the color emitted by the display can be tuned by changing the band gap (energy difference between HOMO and LUMO of the light emitting polymer). The change can be accomplished by using different side chains (e.g., change from alkyl to alkoxy) or by using a different monomeric unit. An example of the latter may include a polymer with a single repeating structure represented by $(A-B)_n$, where "A" and "B" are monomeric units of the polymer, and n is the number of repeating units. As one example, the "A" unit may include one, two, or three thiophene rings in different polymer compositions. When "A" has one thiophene ring, the polymer may emit blue light. When "A" has two and three thiophene rings, the polymer may emit green light and yellow light, respectively. Unfortunately, thiophene tends to emit light at a lower intensity compared to other light-emitting polymers. Therefore, even if it gives the desired color, the intensity of light at that particular range of wavelengths may be too low for use in an OLED.

In still other attempts to affect the light emitted from an organic LED, a low molecular weight dye may be doped into a polymer host. From a practical standpoint, however, low molecular weight dyes tend to crystallize, causing phase separation which results in poor electronic devices.

SUMMARY OF THE INVENTION

The present invention is directed to copolymers comprising at least one first monomeric unit and at least one second monomeric unit, wherein the at least one first monomeric unit is electron-rich, the at least one second monomeric unit is electron-deficient and, optionally, a fluorophore. In some embodiments, only electron-rich and electron-deficient monomeric groups can be used and still achieve the desired emission color. In other embodiments, a fluorophore monomeric unit or dye may be incorporated into the polymer chain to achieve the desired color of emission. If the copolymer includes fluorophore monomeric units, the number of fluorophore monomeric units may be no more than approximately five percent of a number of the sum of electron-rich and electron-deficient monomeric groups. In some embodiments, the fluorophore monomeric unit may be different compared to the rest of the copolymer. The copolymer may be useful in electronic devices, such as displays and the like.

In one set of embodiments, a copolymer can comprise first monomeric units, second monomeric units, and fluorophore monomeric units. Each of the first monomeric units can comprise an electron-rich group, and each of the second monomeric units can comprise an electron-deficient group. Within the copolymer the number of fluorophore monomeric units may comprise no more than approximately five percent of the sum of the number of first and second monomeric units.

In another set of embodiments, a copolymer can comprise a first monomeric unit and second monomeric unit. The first monomeric unit can be selected from:

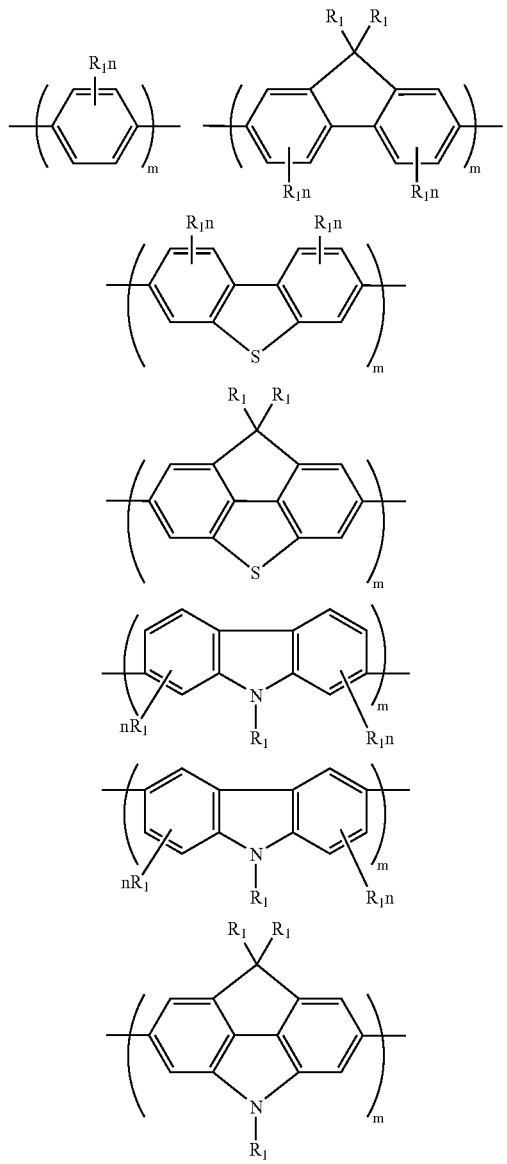

-continued

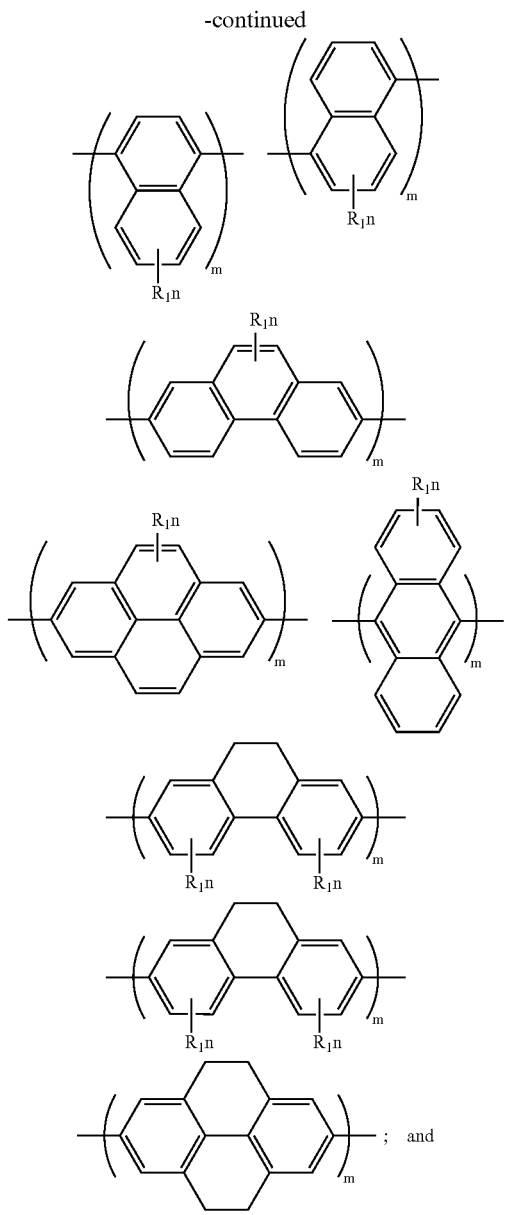

the second monomeric unit can be select from:

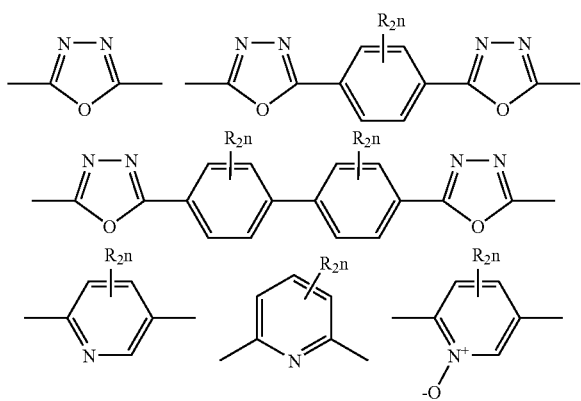

-continued

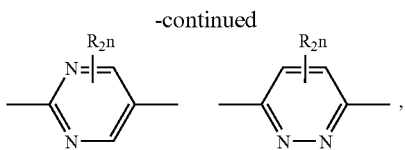

wherein:
R1 can be the same or different at each occurrence and is selected from hydrogen, alkyl, and alkyl derivative groups;
the alkyl derivative group comprises an alkyl group where one or more —$CH_2$— units are replaced by a moiety selected from —O—, —S—, $C_{2-14}$ aryl, and —NR'—, wherein R' comprises a $C_{1-100}$ saturated hydrocarbon group;
R2 can be the same or different at each occurrence and is selected from hydrogen, alkyl, fluoro, cyano, nitro, trifluoromethyl, and sulfo groups;
n is a number of potential sites in a corresponding aromatic group capable of substitution by R1 or R2;
m is from 1 to 10; and
each of the first and second monomeric units may be selected from a combination of the above aromatic groups connected by a single bond, ethenyl or ethynyl group.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
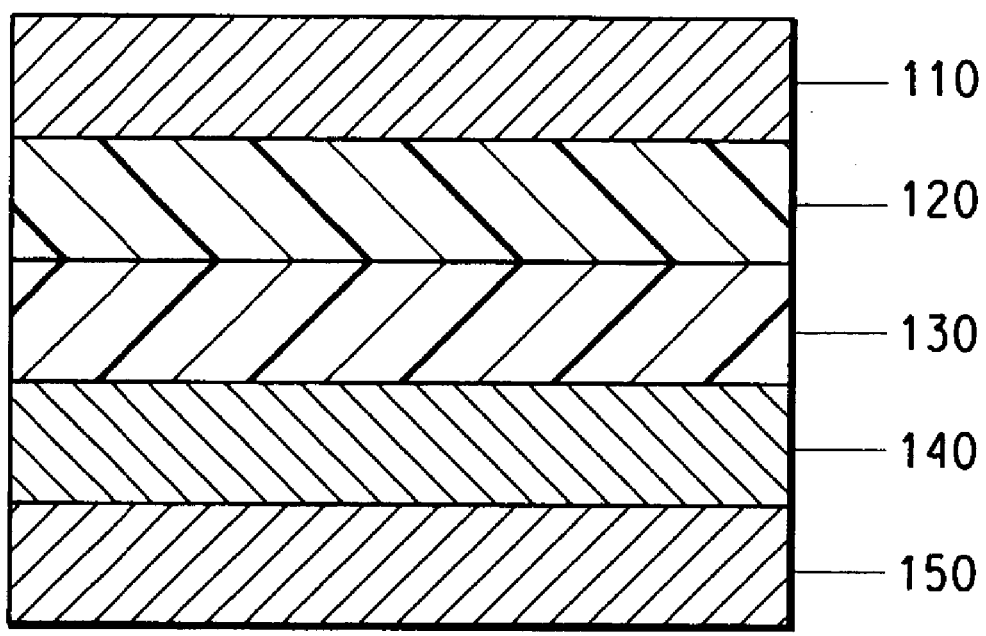
FIG. 1 includes an illustration of a cross-sectional view of an electronic device that includes a copolymer with electron-rich, electron-deficient, and fluorophore monomeric units in an active layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

Reference is now made in detail to the exemplary embodiments of the invention, examples of which are illustrated in the accompanying drawings. Wherever possible, the same reference numbers will be used throughout the drawings to refer to the same or like parts (elements).

Different formulations of copolymers can be used to adjust or "tune" the energy levels (HOMO and LUMO) and color of light emitted from electronic devices, such as organic light emitting devices. The copolymer may principally include electron-rich and electron-deficient monomeric units. A relatively small amount of fluorophore monomeric units may also be incorporated into the polymer main chain to adjust the color of the light emitted without significantly affecting the electronic properties of the rest of the polymer.

The copolymer can be used in displays and potentially other electronic devices.

In some embodiments, the number of fluorophore monomeric units may comprise no more than approximately five percent of the sum of the electron-rich and electron-deficient monomeric units. In this manner, the properties of the copolymer (other than color of emission) can be more dominated by the electron-rich and electron-deficient monomeric units elsewhere in the copolymer rather than the fluorophore monomeric units. In addition, since the fluorophore monomeric units were incorporated into the main chain polymer, the possibility of phase separation, which is common in polymer/dye blends or doped polymer systems, is eliminated. The ability to tune the color of emission without completely changing the copolymer composition or doping with small molecule dyes allows greater flexibility for designers of electronic devices that comprise the copolymer.

Before addressing details of embodiments described below, some terms are defined or clarified. The term "fluorophore monomeric unit" is intended to mean a monomeric unit within a copolymer, where the monomeric fluorophore unit is capable of emitting a different color of light than that emitted from the polymer main chain.

As used herein, the term "alkyl" is intended to mean a group derived from an aliphatic hydrocarbon and includes linear, branched and cyclic groups which may be unsubstituted or substituted. The term "aryl" is intended to mean a group derived from an aromatic hydrocarbon which may be unsubstituted or substituted. The phrase "adjacent to," when used to refer to layers in a device, does not necessarily mean that one layer is immediately next to another layer. The term "active" refers to any material that exhibits electroluminescence or other electro-radiative properties. The term "monomeric unit" refers to a repeating unit in a polymer.

The term "low work function material" is intended to mean a material having a work function no greater than about 4.4 eV. The term "high work function material" is intended to mean a material having a work function of at least approximately 4.4 eV.

The term "low molecular weight polymer" is intended to mean a polymer having a molecular weight no greater than approximately $10^4$ g/mol. A "high molecular weight polymer" is intended to mean a polymer having a molecular weight at least approximately $10^5$ g/mol.

"Room temperature" is intended to mean a temperature in a range of approximately 20–25° C.

The terms "main chain polymer" or "main chain" are intended to mean a portion of the polymer having the longest portion of contiguous groups. The terms "polymer side chain" or "side chain" are intended to mean a portion of the polymer not lying along the main polymer chain. Typically, other groups attached to main chain are polymer side chains.

As used herein, the terms "comprises," "comprising," "includes," "including," "has," "having" or any other variation thereof, are intended to cover a non-exclusive inclusion. For example, a process, process, article, or apparatus that comprises a list of elements is not necessarily limited only those elements but may include other elements not expressly listed or inherent to such process, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Group numbers corresponding to columns within the periodic table of the elements use the "New Notation" convention as seen in the *CRC Handbook of Chemistry and Physics*, 81$^{st}$ Edition (2000–2001).

To the extent not described herein, many details regarding specific materials, processing acts, and circuits are conventional and may be found in textbooks and other sources within the organic light-emitting display, photodetector, photovoltaic, and semiconductor arts.

Attention is now directed to more specific details of embodiments that illustrate and not limit the invention. An electronic device can be made with a copolymer having the following molecular structure.

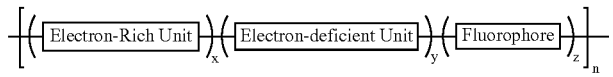

The x and y values can be identical or different from each other. Within the copolymer, a combination of the electron-rich monomeric units and electron-deficient monomeric units ("x" and "y") typically comprises from approximately 95 to 99.5% of the polymer. However, in some embodiments, z may be zero. In still other embodiments, the ratio of electron-rich monomeric units to electron-deficient monomeric units can be in a range of approximately 1:100 to 100:1. In many embodiments, the ratio is close to 1:1. The number of repeating units ("n") is typically at least approximately 2 and no greater than approximately 3000. In many embodiments, the polymer is a high molecular weight polymer.

In many embodiments, a fluorophore monomeric unit can be used in the copolymer. The number of fluorophore monomeric units ("z") is usually in a range of approximately 0.1% to 5% of the number of other monomeric units ("x"+"y") within the copolymer. The conjugated polymer can have a fluorophore monomeric unit that tunes the color of emission. The fluorophore monomeric unit can be incorporated into the polymer either within the polymer chain or as end-cap groups.

Many different compositions of the copolymer are possible. The following paragraphs includes some exemplary, non-limiting molecular structures that can be used for monomeric units. The electron-rich monomeric unit can be selected from:

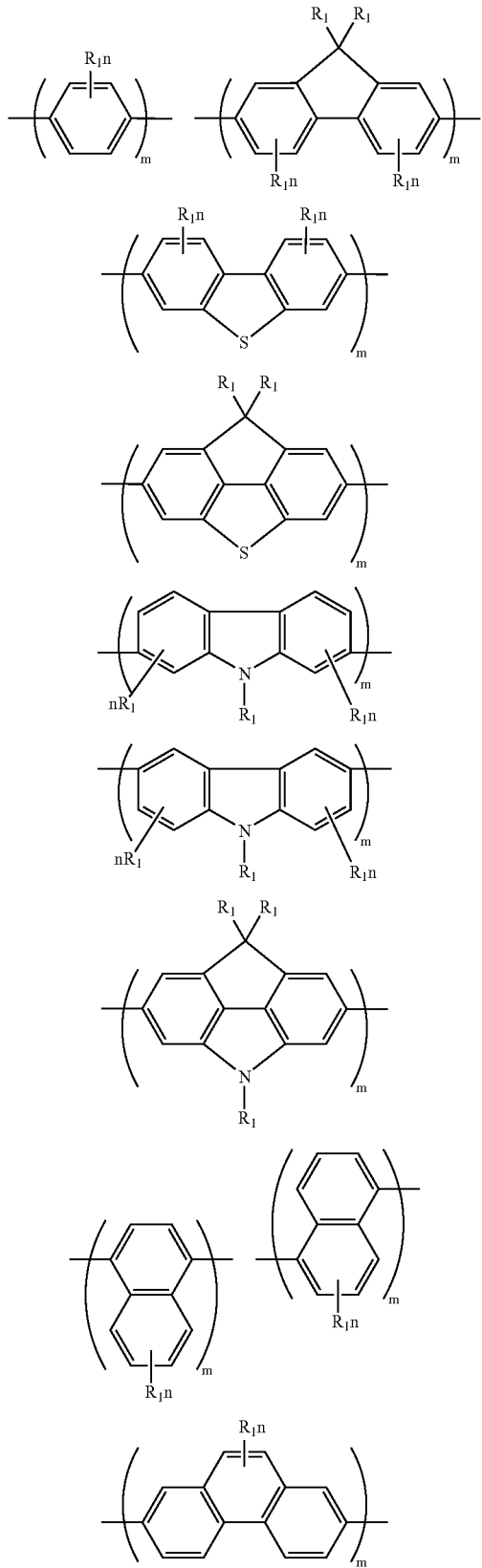

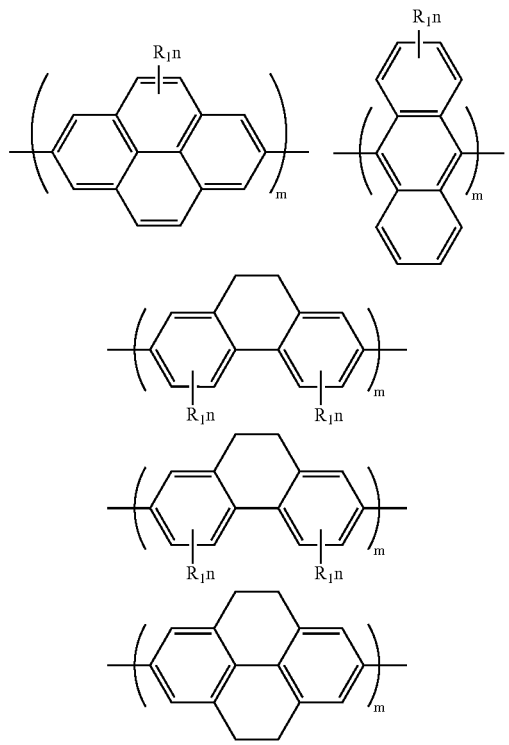

where:
R1 can be the same or different at each occurrence and is selected from hydrogen, alkyl, and alkyl derivative groups;
the alkyl derivative group comprises an alkyl group where one or more —$CH_2$— units are replaced by a moiety selected from —O—, —S—, $C_{2-14}$ aryl, and —NR'—, wherein R' comprises a $C_{1-100}$ saturated hydrocarbon group;
n is a number of potential sites in a corresponding aromatic group capable of substitution by R1;
m is from 1 to 10; and
the first monomeric unit may be selected from a combination of the above aromatic groups connected by singly bond, ethenyl or ethynyl group.

The electron-deficient monomeric unit can be selected from:

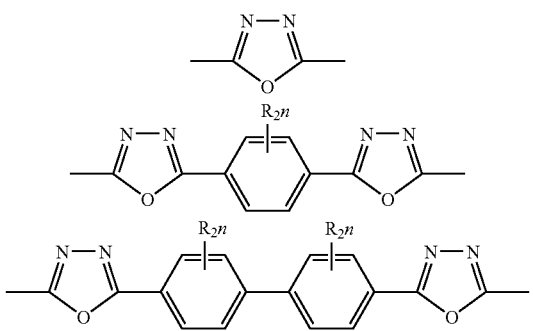

-continued

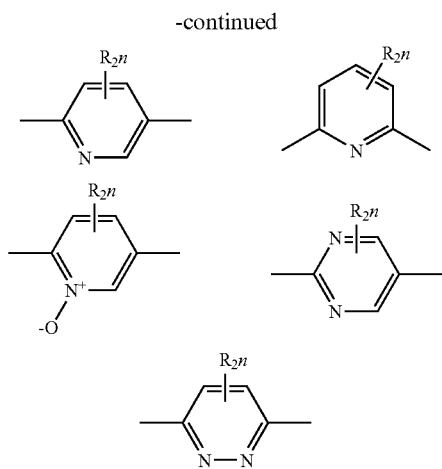

wherein:
R2 can be the same or different at each occurrence and is selected from hydrogen, alkyl, fluoro, cyano, nitro, trifluoromethyl, and sulfo groups;
n is a number of potential sites in a corresponding aromatic group capable of substitution by R2; and
the second monomeric unit may be singly or doubly bonded to another monomeric unit.

When the fluorophore monomeric unit lies within the main polymer chain (other than at end-cap locations), the fluorophore monomeric unit can be selected from:

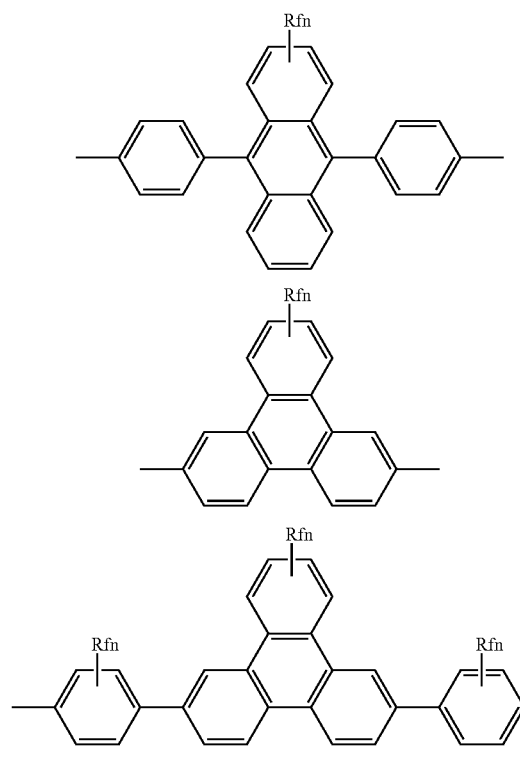

-continued

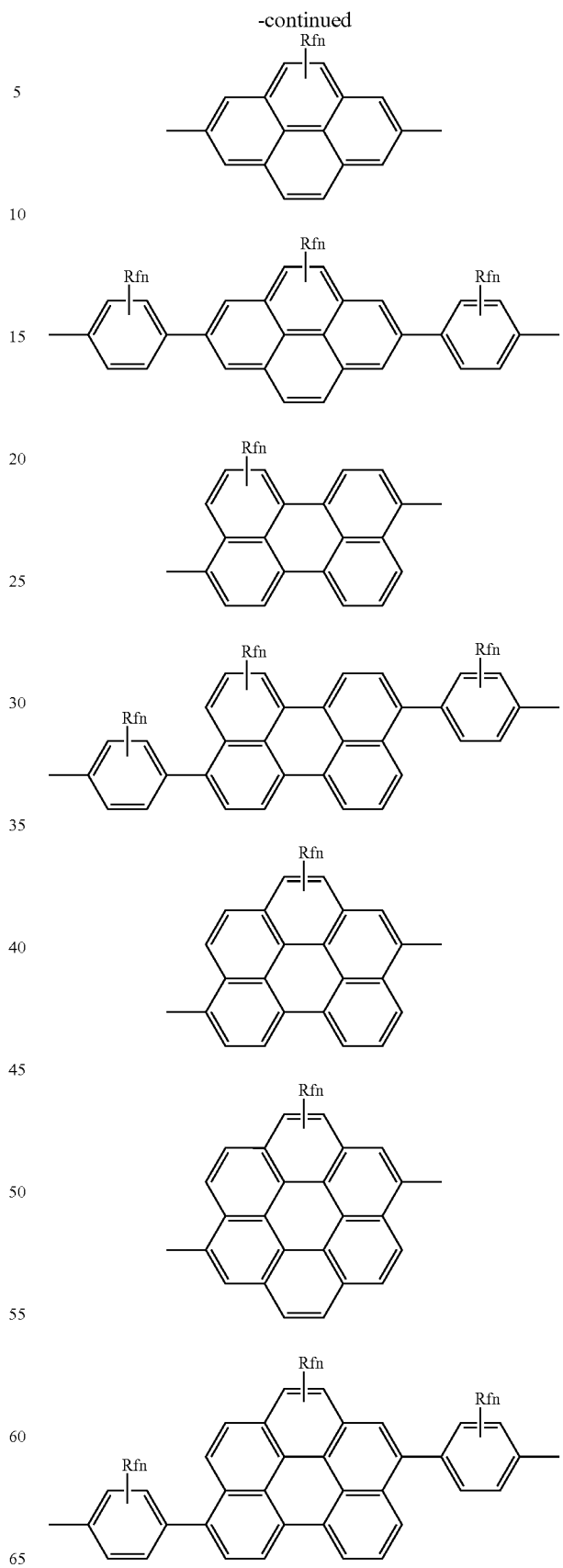

wherein:
   Rf can be the same or different at each occurrence and is selected from hydrogen, halogen, alkyl, alkoxy, and alkylamino groups; and
   n is a number of potential sites in a corresponding aromatic group capable of substitution by Rf.

The fluorophore monomeric unit may be located at an end-cap location for the polymer. When the fluorophore monomeric unit is located at an end-cap location, the fluorophore monomeric unit can be selected from:

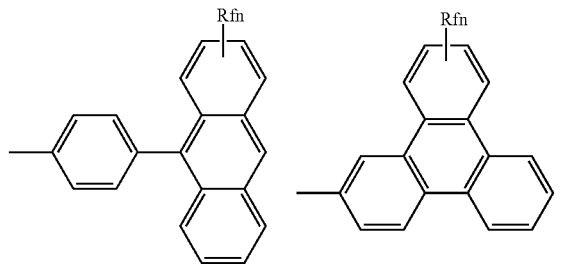

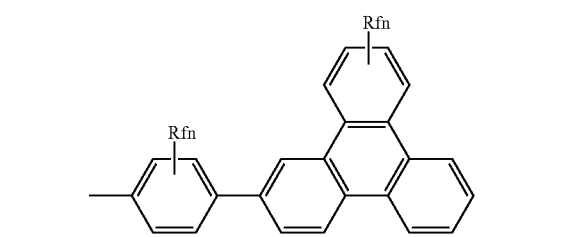

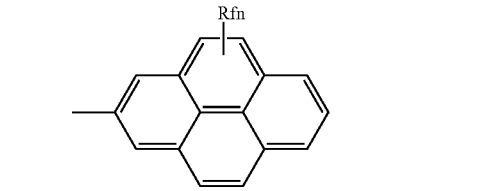

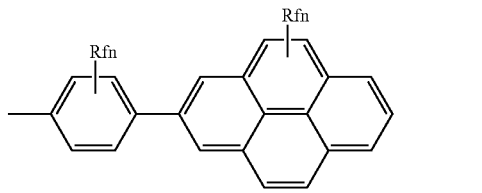

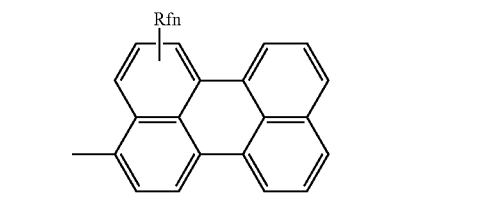

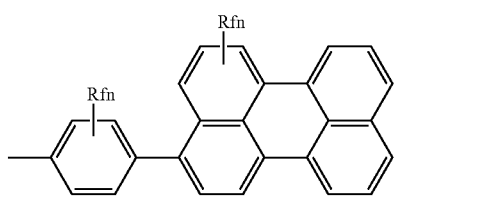

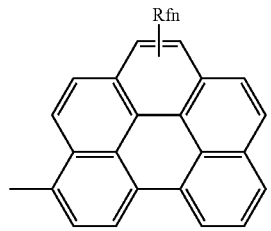

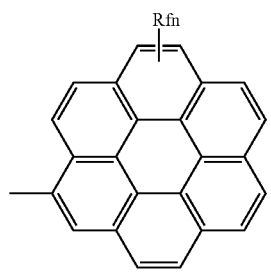

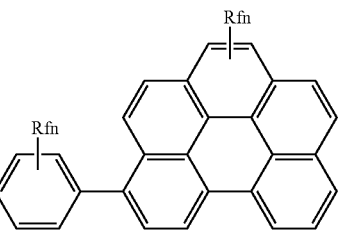

wherein:
   Rf can be the same or different at each occurrence and is selected from hydrogen, halogen, alkyl, alkoxy, and alkylamino groups; and
   n is a number of potential sites in a corresponding aromatic group capable of substitution by Rf;

Alternatively, a fluorophore monomeric unit can comprise a dye that may be used as an end-cap unit. The dye may be selected from:

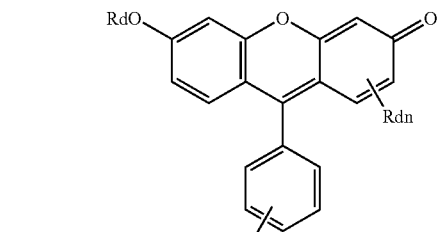

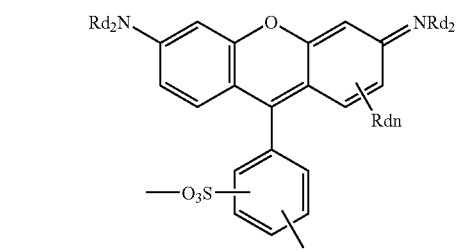

-continued

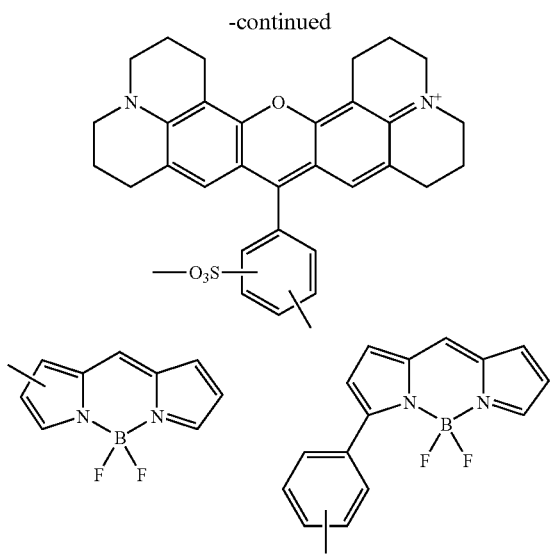

wherein:
Rd can be the same or different at each occurrence and is selected from hydrogen, halogen, alkyl, alkoxy, and alkylamino groups; and
n is a number of potential sites in a corresponding aromatic group capable of substitution by Rd.

The electron-deficient monomeric units typically include a nitrogen-containing heteroaromatic ring. In many instances, the electronic-deficient monomeric units include nitrogen-containing heteroaromatic rings along the main polymer chain (excludes side chains). For example, the nitrogen-containing heteroaromatic ring may be oxadiazole. In some embodiments, the fluorophore monomeric units may comprise perylene groups.

Preparation and Synthesis of Polymers

The description below includes some generic details regarding the formation of monomeric units and using those monomeric units to form copolymers. Later in this specification, specific examples are given to better illustrate and not limit the invention.

Monomers used for preparing the polymers generally include aromatic groups (electron-rich, electron-deficient, or the fluorophore monomeric units as described above) having two functional groups including dibromo-aromatic compounds, diboronic acids, dicarboxylic acid compounds, or the like.

Methods of synthesizing monomeric units having two bromine groups can be obtained, for example, by dibromination of an aromatic compound in chloroform. Diboronic acids can be synthesized, for example, by converting a dibromo-aromatic compound to a Grignard reagent then quenching the reaction with trimethylborate. Dicarboxylic acid can be synthesized for example, by converting a dibromo-aromatic compound to a Grignard reagent and then quenching it with a $CO_2$ using a conventional technique or by a Suzuki coupling reaction from the dibromo-aromatic compound and caboxyphenylboronic acid using a conventional technique.

When starting with dibromo monomers, the polymerization can be done oxidatively or by using copper/triphenylphosphine or nickel/triphenylphosphine catalysis. Aromatic diboronic acids and aromatic dihalides or mixed aromatic halides/boronic acids can be polymerized by coupling reactions using palladium catalysis. When starting from aromatic dicarboxylic acid or mixed aromatic dicarboxylic acids, the polymerization can be carried out by reacting with an equivalent amount (on a mol basis) of hydrazine hydrochloride. Each of these polymeric reactions is performed using conventional techniques.

Energy Level Measurement for HOMO and LUMO and Other Characterization

The onset potential of p-doping (oxidation) and n-doping (reduction) in cyclic voltammetry can be used to determine the energy level of highest occupied molecular orbital ("HOMO") and lowest unoccupied molecular orbital ("LUMO"). In one conventional technique, the energy levels (in electron volts, eV) can be obtained by adding approximately 4.4 volts to the corresponding electrochemical potentials (vs. saturated calomel electrode or "SCE").

The molecular weight and molecular weight distribution are fundamental characteristics of a polymer sample. Gel permeation chromatography ("GPC"), more correctly termed "size exclusion chromatography," can be used for characterization of molecular weight and distribution of molecular weight in the polymers.

Electronic Device and its Fabrication

The present invention also relates to an electronic device comprising at least one organic active material (usually a semiconductor conjugated polymer) positioned between two electrical contact layers, wherein at least one of the layers of the device includes the copolymer of the invention. As shown in FIG. 1, a typical device has an anode layer 110, a cathode layer 150 and an active layer 130. Adjacent to the anode layer 110 is an optional hole-injecting/transport layer 120. Adjacent to the cathode layer 150 is an optional electron-injection/transport layer 140. Between the hole injection/transport layer 120 and the cathode layer 150 (or optional electron injection/transport layer 140) is the active layer 130. The copolymers described above may be used in the hole injection/transport layer 120, the active layer 130, the optional electron-injection/transport layer 140, or any combination thereof.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 150. The anode can include materials containing a metal, mixed metal, alloy, metal oxide or mixed-metal oxide. Suitable metals include the Group 11 metals, the metals in Groups 4, 5, and 6, and the Group 8–10 transition metals. If the anode layer 110 is to be light transmitting, mixed-metal oxides of Groups 12, 13 and 14 metals, such as indium-tin-oxide, may be used. Some non-limiting, specific examples of materials for anode layer 110 include indium-tin-oxide ("ITO"), aluminum-tin-oxide, gold, silver, copper, nickel, and selenium. The anode may also comprise an organic material such as polyaniline.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as e-beam evaporation and resistance evaporation. Specific forms of physical vapor deposition include rf magnetron sputtering or inductively-coupled plasma physical vapor deposition ("IMP-PVD"). These deposition techniques are well known within the semiconductor fabrication arts.

The copolymers may function as hole transport materials in layer 120. Other materials which may facilitate hole injection/transport comprise N,N'-diphenyl-N,N'-bis(3-methylphenyl)-[1,1'-biphenyl]-4,4'-diamine (TPD) and bis[4-(N,N-diethylamino)-2-methylphenyl](4-methylphenyl) methane (MPMP); hole transport polymers such as polyvinylcarbazole (PVK), (phenylmethyl)polysilane, poly (3,4-ethylenedioxythiophene) (PEDOT), and polyaniline (PANI), or the like; electron and hole transporting materials such as 4,4'-N,N'-dicarbazole biphenyl (BCP); or light-emitting materials with good hole transport properties such as chelated oxinoid compounds, including tris(8-hydroxyquinolato)aluminum ($Alq_3$) or the like. In some embodiments, if the conductivity of the hole injection/transport layer 120 can be made similar to anode layer 110, the anode layer 110 may not be required and the hole injection/ transport layer 120 can act as the anode for the electronic device.

The hole injection/transport layer 120 can be formed using any conventional means, including spin-coating, casting, and printing, such as gravure printing. The layer can also be applied by ink jet printing, thermal patterning, or chemical or physical vapor deposition.

Usually, the anode layer 110 and the hole injection/transport layer 120 are patterned during the same lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 and hole injection/transport layer 120 typically are formed into substantially parallel strips having lengths that extend in substantially the same direction.

The active layer 130 may comprise the copolymers previously described and in the examples described later in this specification. The particular material chosen may depend on the specific application, potentials used during operation, or other factors. Due to low-emission intensity issues, in some embodiments, thiophenes may not be used in the active layer 130. If low-emission intensity issues are not present or less important, thiophenes may be used within the active layer 130.

The active layer 130 containing the active organic material can be applied from solutions by any conventional technique, including spin-coating, casting, and printing. The active organic materials can be applied directly by vapor deposition processes, depending upon the nature of the materials. In another embodiment, an active polymer precursor can be applied and then convert to the polymer, typically by heating or other source of external energy (light or UV radiated).

Optional layer 140 can function both to facilitate electron injection/transport, and also serve as a buffer layer or confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include metal-chelated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, LiF, $Li_2O$, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). Materials for the second electrical contact layer can be selected from alkali metals of Group 1 (e.g., Li, Na, K, Rb, Cs,), the Group 2 (alkaline earth) metals, the Group 12 metals, the rare earths, the lanthamides (e.g., Ce, Sm, Eu, or the like), and the actinides. Materials such as aluminum, indium, calcium, barium, yttrium, and magnesium, and combinations, may also be used. Specific non-limiting examples of materials for the cathode layer 150 include barium, lithium, cerium, cesium, europium, rubidium, yttrium, magnesium, and samarium.

The cathode layer 150 is usually formed by a chemical or physical vapor deposition process. In general, the cathode layer will be patterned, as discussed above in reference to the anode layer 110 and optional conductive polymer layer 120. If the device lies within an array, the cathode layer 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view).

In other embodiments, additional layer(s) may be present within organic electronic devices. For example, a layer (not shown) between the conductive polymer layer 120 and the active layer 130 may facilitate positive charge transport, band-gap matching of the layers, function as a protective layer, or the like. Similarly, additional layers (not shown) between the active layer 130 and the cathode layer 150 may facilitate negative charge transport, band-gap matching between the layers, function as a protective layer, or the like. Layers that are known in the art can be used. In addition, any of the above-described layers can be made of two or more layers. Alternatively, some or all of inorganic anode layer 110, the conductive polymer layer 120, the active layer 130, and cathode layer 150, may be surface treated to increase charge carrier transport efficiency. The choice of materials for each of the component layers may be determined by balancing the goals of providing a device with high device efficiency with the cost of manufacturing, manufacturing complexities, or potentially other factors.

Although not meant to limit, the different layers may have the following range of thicknesses: inorganic anode layer 110, usually no greater than approximately 500 nm, for example, approximately 10–200 nm; conductive polymer layer 120, usually no greater than approximately 250 nm, for example, approximately 20–200 nm; active layer 130, usually no greater than approximately 1000 nm, for example, approximately 10–80 nm; optional layer 140, usually no greater than approximately 100 nm, for example, approximately 20–80 nm; and cathode layer 150, usually no greater than approximately 100 nm, for example, approximately 30–500 nm. If the anode layer 110 or the cathode layer 150 needs to transmit at least some light, the thickness of such layer may not exceed approximately 100 nm.

Depending upon the application of the electronic device, the active layer 130 can be a light-emitting layer that is activated by signal (such as in a light-emitting diode) or a layer of material that responds to radiant energy and generates a signal with or without an applied potential (such as detectors or voltaic cells). Examples of electronic devices that may respond to radiant energy are selected from photoconductive cells, photoresistors, photoswitches, phototransistors, and phototubes, and photovoltaic cells. After reading this specification, skilled artisans will be capable of selecting material(s) for their particular applications. The light-emitting materials may be dispersed in a matrix of another material, with and without additives, but preferably form a layer alone. The active organic layer 130 generally has a thickness in the range of approximately 50–500 nm.

In polymer light emitting diodes, electrons and holes, injected from the cathode 150 and anode 110 layers, respectively into the active polymer layer 130, form negative and positively charged polarons in the polymer. These polarons migrate under the influence of the applied electric field, forming a polaron exciton with an oppositely charged species and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s) may be electrically connected to the electronic device as part of a circuit but is not illustrated in FIG. 1.

As demonstrated in the examples below, blue, green, and orange light emission can be achieved. For electronic devices with a green emission, quantum efficiency may be as high as approximately 3% when PVK and barium are used as electrodes. Polymer LEDs with relatively high efficiency electroluminescent emissions may also be fabricated using a stable metal as the cathode. For several polymers, the device with aluminum cathode has higher quantum efficiency than the same device with a barium cathode. A quantum efficiency larger than approximately 1% using Polymer 5, 6, 7, or 9 (as identified in examples later in this specification) may be achieved. This may be highest quantum efficiency observed so far for an aluminum cathode device without an additional cathode buffer. Since aluminum is relatively stable in air, it can be useful in practical applications.

The examples below serve to illustrate embodiments of the invention in greater detail. The following abbreviations are used within the examples.

cd/m2=candela per square meter.

$M_n$=number average molecular weight.

$M_w$=weight average molecular weight

PD=polydispersity ($M_w/M_n$) as determined by GPC.

EXAMPLES

The first set of examples includes descriptions related to preparing suitable precursors for monomers or monomers that can be later used in the synthesis of the copolymer. The second set of example includes descriptions of copolymer synthesis.

Example 1

The following example is used to exemplify the synthesis of 3,7-dimethyloctylbromide for its potential use as a side chain within an electron-rich monomer. The compound has the following molecular structure.

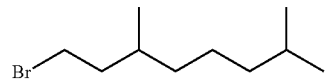

A solution of 3,7-dimethyl-1-octanol (approximately 130 g or 0.8 mole) and pyridine (approximately 1.9 g or 24 mmol) can be stirred and cooled in ice/water bath, to which phosphorus tribromide (approximately 220 g or 0.8 mole) can be added dropwise. After addition of the phosphorus tribromide, the mixture can be stirred at room temperature for approximately one hour and at 50° C. for an additional hour. The reaction mixture is cooled down to approximately 0° C., and then treated slowly with excess amount of dilute aqueous $K_2CO_3$. The resulting mixture can be extracted with ethyl acetate, and the combined organic layer can be washed using water, and then dried over $MgSO_4$. Evaporation of the organic solvent can result in a crude product, which may be purified by vacuum distillation (approximately 100–104° C./5 mm Hg absolute pressure). The yield may be approximately 120 g (65%).

$^1$H-NMR (200 MHz, $CDCl_3$) δ ppm: 3.3–3.6 (m, 2H, H-methylene), 1.1–2.0 (m, 10H, H-methylene and methylidyne), 0.89 (d, 3H, J=6 Hz, H-methyl), 0.87 (d, 6H, J=6 Hz, H-methyl).

Example 2

In this example, synthesis of 9,9-bis(3',7'-dimethyloctyl)-2,7-dibromofluorene, which can be used as an electron-rich monomer, is described.

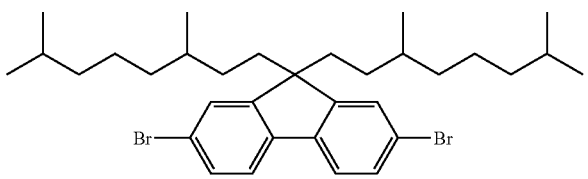

A stirred mixture of 2,7-dibromofluorene (approximately 25 g or 77 mmol) and dimethyl sulfoxide ("DMSO") (approximately 250 ml) under nitrogen can be prepared. Catalytic amounts of benzyltriethylammonium chloride (approximately 0.19 g or 0.85 mmol) and an aqueous solution of sodium hydroxide (nominal 50 weight %, approximately 125 ml) may be added to the stirred mixture. 3,7-Dimethyloctylbromide (approximately 36 g or 160 mmol) can be added dropwise and the mixture and stirred at approximately 100° C. for approximately two hours. After cooling, the mixture may be extracted by ethyl acetate (3×150 ml). The organic layer can be separated, washed with water, and then dried over $MgSO_4$. Further purification by column chromatography (silica gel, hexanes as eluent) can produce a greenish liquid product. The yield is approximately 40 g (86%).

$^1$H-NMR (200 MHz, $CDCl_3$) δ ppm: 7.52 (dd, 2H, J=8 Hz, 2 Hz, fluorene ring), 7.46 (d, 2H, J=2 Hz, fluorene ring), 7.43 (d, 2H, J=2 Hz, fluorene ring), 1.8–2.0 (m, 4H, H-methylene), 1.38–1.50 (m, 2H, H-methylidyne), 0.90–1.20 (m, 16H, H-methylene), 0.81(d, 12H, J=8 Hz, H-methyl), 0.69 (d, 6H, J=6 Hz, H-methyl), 0.35–0.65 (m, 2H, H-methylidyne).

Example 3

In this example, synthesis of 9,9-bis(3',7'-dimethyloctyl)-2,7-dicarboxylic acid (D1-76), which can be used as an electron-rich monomer, is described.

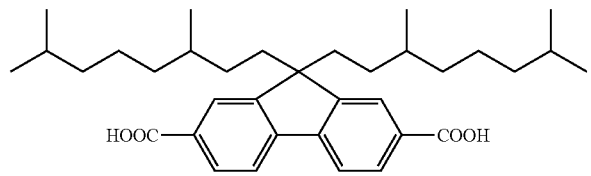

Magnesium turnings (approximately 5.2 g or 22 mmol) can be placed in a nominal 500 ml flask and preheated to approximately 100° C. under dry nitrogen. A trace amount of iodine (approximately 4 mg) can be added followed by first part of a solution of 9,9-bis(3',7'-dimethyloctyl)-2,7-dibromofluorene (approximately 60 g or 99 mmol) in approximately 120 ml of dry tetrahydrofuran (THF). After the reaction is initialized (as indicated by the color disappearance of the solution), the rest part of the solution can be added dropwise using a syringe. After the addition, the reaction mixture can be refluxed for approximately one hour and an additional approximately 120 ml of dry THF can be added.

The reaction mixture is then cooled to room temperature and then transferred to another flask with approximately 500 g of dry ice. The mixture can be stirred with a mechanical stirrer until dry ice is well mixed with the reaction mixture. After an excess amount of dry ice is evaporated, approximately 1000 ml of nominal 18% hydrochloric acid can be added to the residue. The crude product may be precipitated as a white solid, isolated by filtration, and washed using water. After drying, further purification by recrystallization from ethyl acetate can produce the product as a white solid. The yield can be approximately 37 g (70%).

$^1$H-NMR (200 MHz, DMF) δ ppm: 8.19 (s, 2H, fluorene ring), 8.11 (s, 2H, fluorene ring), 8.03 (s, 2H, fluorene ring), 2.1–2.35 (m, 4H, H-methylene), 1.30–1.50 (m, 2H, H-methylidyne), 0.90–1.10 (m, 16H, H-methylene), 0.77 (d, 12H, J=6 Hz, H-methyl), 0.68 (d, 6H, J=6 Hz, H-methyl), 0.35–0.65 (m, 2H, H-methylidyne).

Example 4

In this example, synthesis of 9,9-bis(3',7'-dimethyloctyl)-2,7-fluorenebis(p-benzoyl acid) (D1-82), which can be used as an electron-rich monomer unit, is described.

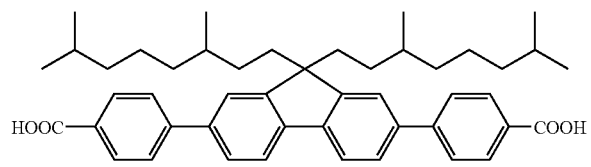

A mixture of 9,9-bis(3',7'-dimethyloctyl)-2,7-dibromofluorene (approximately 12 g or 20 mmol), 4-carboxyphenylboronic acid (approximately 7.2 g or 43 mmol), tetrakis (triphenylphosphine) palladium (approximately 1.2 g or 1.0 mmol), benzyltriethylammonium chloride (approximately 1.2 g or 5.2 mmol) in approximately 120 ml acetonitrile is made. An aqueous solution of potassium carbonate (nominal 2 M, approximately 120 ml) can be added to the mixture. The mixture can be heated to reflux under nitrogen for approximately 72 hours. After cooling to room temperature, hydrochloric acid (nominal 18%, approximately 200 ml) is added to the mixture. The crude product can be precipitated as a white solid, isolated by filtration, and washed using water. After drying, the crude product can be purified by recrystallization from a mixture of THF and acetonitrile. The yield can be approximately 12 g (89%).

$^1$H-NMR (200 MHz, $d_7$-DMF) δ ppm: 8.15 (d, 4H, J=8 Hz, H-benzene), 8.08 (s, 2H, H-fluorene), 8.04 (s, 2H, H-fluorene), 7.98 (d, 4H, J=8 Hz, H-benzene), 7.85 (dd, 2H, J=8 Hz, J=2 Hz, H-fluorene), 2.2–2.4 (m, 4H, H-methylene), 1.25–1.1.42 (m, 2H, H-methylidyne), 0.90–1.10 (m, 16H, H-methylene), 0.72 (d, 12H, J=8 Hz, H-methyl), 0.69 (d, 6H, J=6 Hz, H-methyl), 0.45–0.65 (m, 2H, H-methylidyne).

Example 5

In this example, synthesis of 9,9-bis(2'-ethylhexyl)-2,7-dibromofluorene, which can be used as an electron-rich monomer, is described.

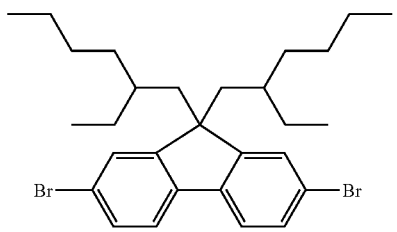

A stirred mixture can be created and include 2,7-dibromofluorene (approximately 60 g or 190 mmol) and DMSO (approximately 600 ml) under $N_2$. Catalytic amounts of benzyltriethylammonium chloride (approximately 0.46 g or 2.0 mmol) and aqueous NaOH solution (nominal 50 weight %, approximately 300 mL) can be added to the stirred mixture. 2-ethylhexyl bromide (approximately 75 g or 390 mmol) is also added dropwise. The resulting mixture can be agitated at approximately 60° C. for approximately two hours. Water and ethyl acetate (approximately 300 ml each) can then be added to the reaction mixture and stirred for approximately 15 minutes. The organic layer can be separated, washed with water, and then dried over $MgSO_4$. After removing the solvent, the product can be purified by silica gel column chromatography and eluted by hexanes to produce the product as a pale yellow oil. The yield can be approximately 73 g (73%).

$^1$H-NMR (500 MHz, $CDCl_3$) δ ppm: 7.51 (d, J=8.5 Hz, 2H, fluorene ring), 7.48 (d, 2H, J=5 Hz, fluorene ring), 7.44 (d, J=8 Hz, 2H, fluorene ring), 1.94 (m, 4H, H-alkyl), 0.64–0.98 (m, 22H, H-alkyl), 0.45–0.56 (m, 8H, H-alkyl).

Example 6

In this example, synthesis of 9,9-bis(2'-ethylhexyl)-2,7-fluorenedicarboxylic acid (D1-69), which can be used as an electron-rich monomer, is described.

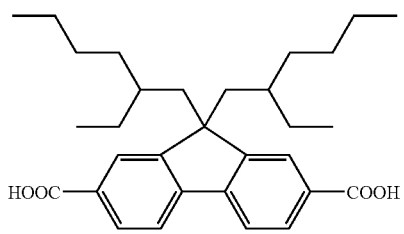

Magnesium turnings (approximately 8 g or 0.33 mol) can be placed in a nominal 500 ml flask and preheated to approximately 100° C. under dry nitrogen. A small amount of iodine (approximately 5 mg) is added followed by first part of a solution of 9,9-bis(2'-ethylhexyl)-2,7-dibromofluorene (approximately 80 g or 0.15 mmol) in approximately 160 ml of dry THF. After the reaction is initialized (as indicated by the color disappearance of the solution), the rest of the solution can be added dropwise by a syringe.

After the addition, the reaction mixture can be refluxed for approximately one hour and an additional approximately 160 ml of dry THF is added. The reaction mixture can be then cooled to room temperature and approximately 1500 g of dry ice is added. Next, it can be shaken until the dry ice is well mixed with the reaction mixture. After an excess amount of dry ice is evaporated, hydrochloric acid (nominal 18%, approximately 1500 ml) can be added to the residue. The product may be precipitated as a white solid and isolated by filtration. Then, it can be washed by water and hexane. Further purification by recrystallization from ethyl acetate can produce a white solid. The yield is approximately 38 g (55%).

$^1$H-NMR (500 MHz, THF-$d_8$) δ ppm: 8.17 (t, J=6.5 Hz, 2H, fluorene ring), 8.06 (d, 2H, J=8 Hz, fluorene ring), 7.89 (d, J=8 Hz, 2H, fluorene ring), 2.13 (d, J=5 Hz, 4H, H-alkyl), 0.65–0.95 (m, 22H, H-alkyl), 0.45–0.54 (m, 8H, H-alkyl).

Example 7

In this example, synthesis of 9,9-bis(2'-ethylhexyl)-2,7-fluorenedi(p-benzoyl acid) (D1-68), which can be used as an electron-rich monomer, is described.

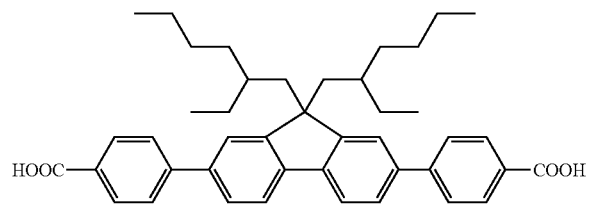

A mixture of 9,9-bis(2'-ethylhexyl)-2,7-dibromofluorene (approximately 8 g, 15 mmol), 4-carboxy-phenylboronic acid (approximately 5 g or 30 mmol), tetrakis(triphenylphosphine)palladium (approximately 0.5 g or 0.4 mmol) in approximately 60 ml acetonitrile can be formed. An aqueous solution of potassium carbonate (nominal 2 M, approximately 60 ml) can be added. The mixture can be heated to reflux under nitrogen for approximately 12 hours. After cooling to room temperature, hydrochloric acid (nominal 18%, approximately 500 ml) can be added to the mixture. The crude product may be precipitated as a white solid, isolated by filtration, and washed using water and hexane. After drying, the crude product can be purified by recrystallization from ethyl acetate. The yield can be approximately 8 g (90%).

$^1$H-NMR (200 MHz, $d_7$-DMF) δ ppm: 8.16 (d, 4H, J=8 Hz, H-benzene), 8.09 (s, 2H, H-fluorene), 8.05 (s, 2H, H-fluorene), 7.98 (d, 4H, J=8 Hz, H-benzene), 7.85 (dd, 2H, J=8 Hz, J=2 Hz, H-fluorene), 2.28–2.36 (m, 4H, H-methylene), 0.70–1.1 (m, 18H, H-methylene and methylidyne), 0.49–0.52 (m, 12H, H-methyl).

Example 8

In this example, synthesis of 9,9-bis(2'-ethylhexyl)-2-bromo-7-fluorenecarboxylic acid (D1-110), which can be used as an electron-rich monomer, is described.

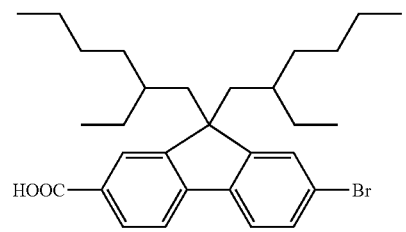

A solution of 9,9-bis(2'-ethylhexyl)-2,7-dibromofluorene (approximately 50 g or 91 mmol) in approximately 250 ml anhydrous THF can be cooled in a dry ice/acetone bath, to which a solution of tert-butyllithium in pentane (nominal 1.7 M, approximately 60 ml) can be added dropwise. After the addition, the temperature of the reaction mixture is taken to room temperature. The mixture is stirred for an additional approximately 10 minutes. The mixture can be cooled again in a dry ice/acetone bath and bubbled with dry carbon dioxide for approximately one hour. Carbon dioxide bubbling can be continued for another approximately three hours after the temperature of the mixture is taken to room temperature.

Hydrochloric acid (nominal 18%, approximately 300 ml) can be added to the mixture, and the mixture is extracted by ethyl acetate (2×200 ml). The combined organic layers can be dried over MgSO$_4$, and the solvent can be evaporated. Purification of the crude product is performed using a silica gel column. Substantially pure hexane can be used as an eluent to recover 9,9-bis(2'-ethylhexyl)-2,7-dibromofluorene, then a mixture of hexane/THF at a ratio of approximately 5:1 can be used as an eluent to obtain the product. The yield was approximately 33 g (71%).

$^1$H-NMR (200 MHz, CDCl$_3$) δ ppm: 7.4–8.2 (m, 6H, H-Fluorene), 1.8–2.3 (m, 4H, H-methylene), 0.40–1.1 (m, 30H, H-methyl, methylene and methylidyne).

Example 9

In this example, synthesis of 9,9-bis(2'-ethylhexyl)fluorene-2-carboxy-7-benzoyl acid (D1-115), which can be used as an electron-rich monomer, is described.

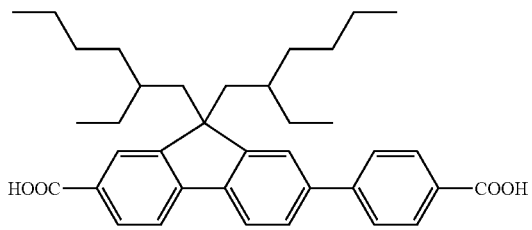

A mixture of 9,9-bis(2'-ethylhexyl)-2-bromo-7-fluorenecarboxylic acid (approximately 19 g or 38 mmol), 4-carboxy-phenylboronic acid (approximately 7.5 g or 45 mmol) tetrakis(triphenylphosphine) palladium (approximately 640 mg or 0.55 mmol), benzyltriethylammonium chloride (approximately 640 mg or 2.7 mmol) in approximately 75 ml acetonitrile can be formed. An aqueous solution of potassium carbonate (nominal 2 M, approximately 75 ml) can be added to the mixture. The mixture is heated to reflux under nitrogen for approximately 24 hours and then cooled to room temperature. Hydrochloric acid (nominal 18%, approximately 200 ml) can be added to the cooled mixture. The crude product may be precipitated as a white solid, isolated by filtration, and washed using water. After drying, the crude product can be purified by recrystallization from ethanol or ethyl acetate. The yield is approximately 18 g (86%).

$^1$H-NMR (200 MHz, $d_7$-DMF) δ ppm: 13.25 (broad peak, 2H, H—COOH), 8.20 (d, 2H, J=8 Hz, phenyl ring), 8.14 (broad peak, 3H, fluorene ring), 8.10 (s, 1H, H-fluorene), 8.09 (s, 1H, H-fluorene), 7.98 (d, 2H, J=8H, H-phenyl), 7.87 (d, 1H, J=8 Hz, H-fluorene), 2.1–2.4 (m, 4H, H-methylene), 0.4–1.1 (m, 30H, H-methyl, H-methylene, H-methylidyne).

Example 10

In this example, synthesis of perylene-3,9-dicarboxylic acid (D1-62), which can be used as a fluorophore monomer or potentially an electron-rich monomer, is described.

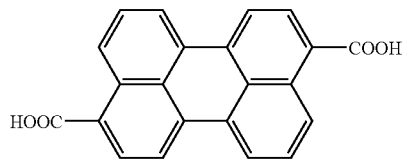

A mixture of 3,9-perylenedicaboxylic acid diisobutyl ester (approximately 10 g or 22 mmol), NaOH (approximately 5 g or 125 mmol) and approximately 100 ml ethanol can be heated to reflux under nitrogen for approximately three hours and then cooled to room temperature. Hydrochloric acid (nominal 18%, approximately 150 ml) is added. The product can be precipitated as a red solid, isolated by filtration, washed using water, and dried. The yield can be approximately 7.1 g (95%).

$^1$H-NMR (200 MHz, $d_7$-DMF) δ ppm: 8.89–9.07 (m, 2H, H-perylene), 8.55–8.65 (m, 4H, H-perylene), 8.31 (dd, 2H, J=8 Hz, J=1.4 Hz, H-perylene), 7.71–7.82 (m, 2H, perylene)

Example 11

In this example, synthesis of poly(9,9-bis(2'-ethylhexyl)fluorene-oxadiazole), which illustrates a copolymer with electron-rich and electron-deficient monomeric units, is described. This copolymer is subsequently referred to as Polymer 1 (D1-122).

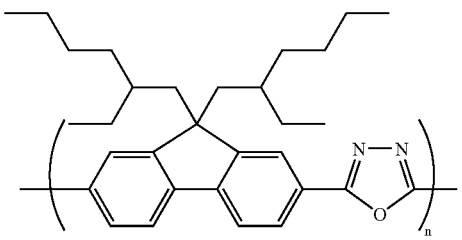

Phosphorus pentoxide (approximately 30 g or 0.21 mol) can be dissolved in approximately 400 ml methylsulfuric acid and stirred at approximately 90–95° C. under nitrogen. A mixture of 9,9-bis(2'-ethylhexyl)fluorene-2,7-dicarboxylic acid (approximately 20 g or 42 mmol) and hydrazine hydrochloride (approximately 2.9 g or 42 mmol) can be added to the solution. The suspension is stirred for approximately 16 hours and a homogenous, viscous solution can be formed.

Figure 2:
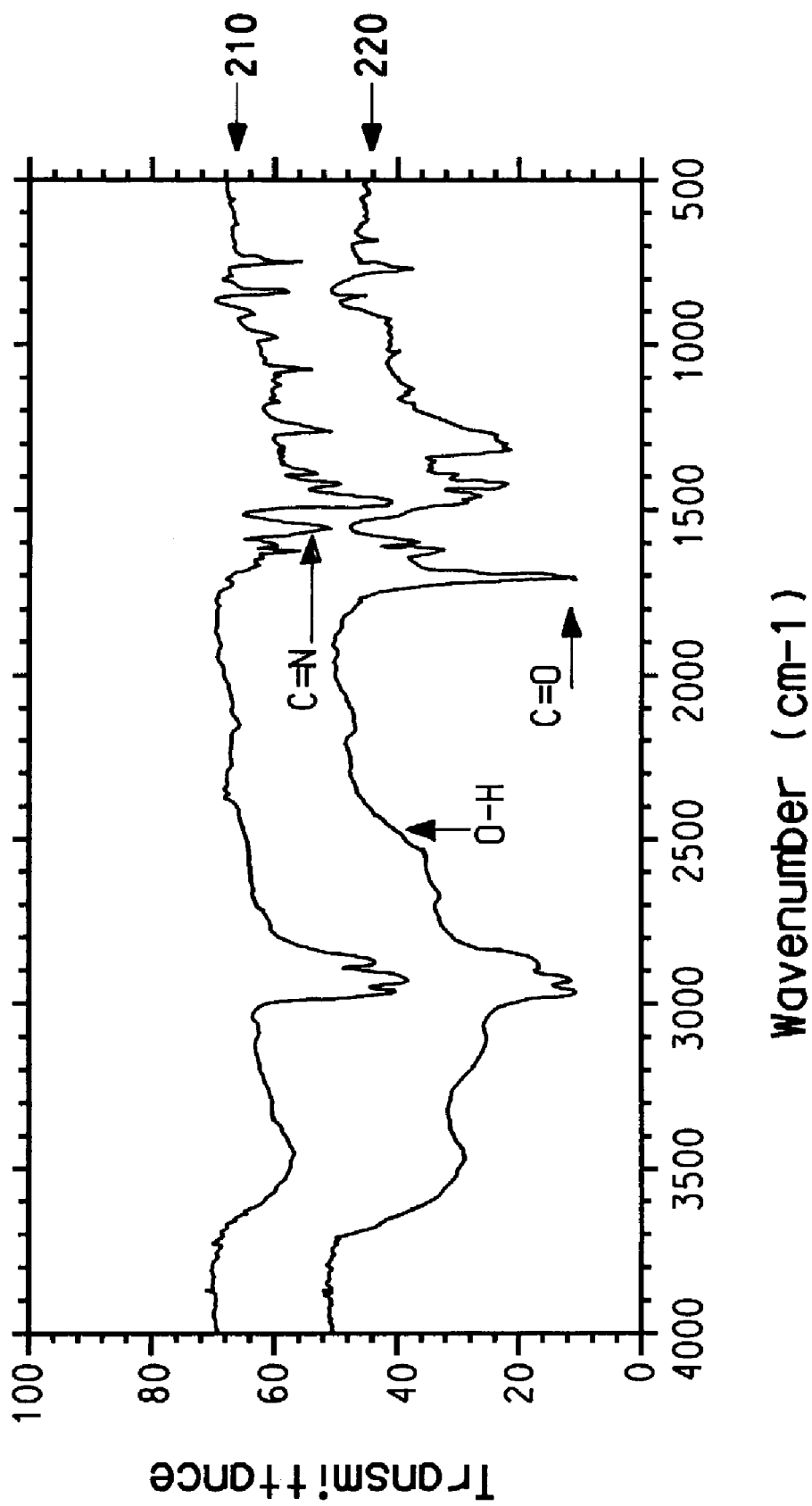
FIG. 2 includes a Fourier Transform Infrared ("FTIR") spectrum collected for a monomer and a corresponding copolymer formed using the monomer.

After cooling the solution to room temperature, the solution can be poured into approximately four liters of water. The polymer can be precipitated, isolated by filtration, washed by water and ethanol, and dried at room temperature in vacuo. The crude polymer can be dissolved in approximately 350 ml of THF. The solution is filtered through a nominal 5 μm filter. The filtered polymer can be then precipitated from a mixture of approximately three liters ethanol and approximately 600 ml water. The polymer can be isolated, washed by water and ethanol, and then vacuum dried at room temperature. This purification process can be repeated two times and product the polymer as a white fiber. The yield is approximately 13 g (68%). FIG. 2 shows the FTIR spectrum (210) of the Polymer 1 and the FTIR spectrum (220) of 9,9-bis(2'-ethylhexyl)fluorene-2,7-dicarboxylic acid (electron-rich monomer). The FTIR data in FIG. 2 confirms that the C=O and O—H peaks in the 9,9-bis(2'-ethylhexyl)fluorene-2,7-dicarboxylic acid (electron-rich monomer) are not significantly visible in Polymer 1. Also, the C=N bond in Polymer 1 is seen.

$^1$H-NMR (500 MHz, THF-$d_8$) δ ppm: 8.42 (s, 2H, fluorene ring), 8.26 (d, 2H, fluorene ring), 8.13 (d, J=8 Hz, 2H, fluorene ring), 2.2–2.5 (br, 4H, H-alkyl), 0.8–1.1 (br, 16H, H-alkyl), 0.59–0.65 (br, 14H, H-alkyl).

Example 12

In this example, synthesis of Polymer 2 (D1-125), which illustrates another copolymer with electron-rich and electron-deficient monomeric units, is described.

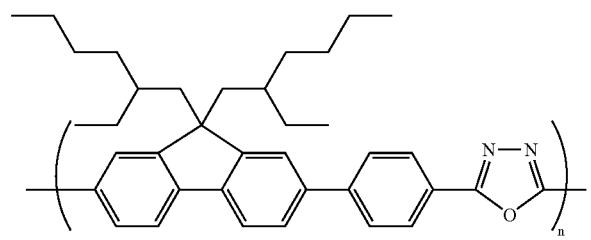

Phosphorus pentoxide (approximately 3.0 g or 21 mmol) can be dissolved in approximately 35 ml of methylsulfuric acid and stirring under nitrogen at approximately 100° C. A mixture of 9,9-bis(2'-ethylhexyl)fluorene-2-carboxy-7-benzoyl acid (approximately 1.5 g or 2.7 mmol) and hydrazine hydrochloride (approximately 190 mg or 2.7 mmol) can be added to the solution. The suspension is stirred for approximately five hours to form a homogenous, viscous solution.

After the solution cools to room temperature, the solution can be poured into approximately 500 ml of water. The polymer may be precipitated and isolated by filtration. The crude polymer can be subsequently washed by aqueous solution of sodium carbonate (nominal 1 M, approximately 500 ml), water, and ethanol, and then dried at room temperature in vacuo. The crude polymer can be dissolved in approximately 20 ml of THF. The solution may be filtered through a nominal 5 μm filter. The polymer can be then precipitated from approximately 500 ml of ethanol. The polymer is isolated, washed using water and ethanol, and then vacuum dried at room temperature. This purification process can be repeated two times and produce the polymer as a white fiber. Yield can be approximately 1.1 g (98%).

$^1$H-NMR (200 MHz, CDCl$_3$) δ ppm: 8.15–8.40 (m, 4H), 7.8–8.0 (m, 4H), 7.65–7.8 (m, 2H), 2.0–2.4 (broad peak, 4H, H-methylene), 0.5–1.0 (two groups of broad peak, 30H, H—methyl, methylene, methylidyne)

Example 13

In this example, synthesis of Polymer 3 (D1-124), which illustrates another copolymer with electron-rich and electron-deficient monomeric units, is described.

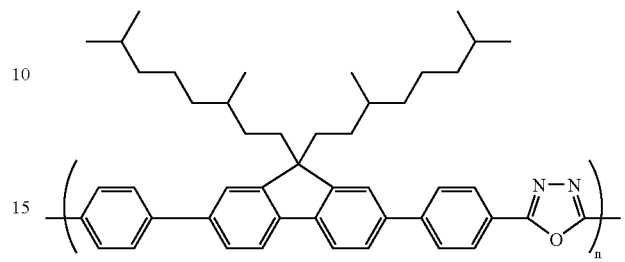

Phosphorus pentoxide (approximately 30 g or 0.21 mol) can be dissolved in approximately 400 ml of methylsulfuric acid and stirring together at approximately 100° C. under nitrogen. A mixture of 9,9-bis(3',7'-dimethyloctyl)-2,7-fluorenebis(p-benzoyl acid) (approximately 7.5 g or 10.9 mmol) and hydrazine hydrochloride (approximately 750 mg or 10.9 mmol) can be added to the solution. The suspension may be stirred for approximately 17 hours to form a homogenous, viscous solution.

After the solution is cooled to room temperature, the solution is poured into approximately four liters of water. The polymer can be precipitated and isolated by filtration. The crude polymer is washed by aqueous solution of sodium carbonate (nominal 1 M, approximately 2000 ml), water and ethanol, and then dried at room temperature in vacuo. The crude polymer can be dissolved in approximately 220 ml of CHCl$_3$. The solution may be filtered through a nominal 10 μm filter. The polymer can be precipitated from approximately two liters of ethanol, isolated and washed using water and ethanol, and then vacuum dried at room temperature. This purification process may be repeated two times and product the polymer as a white fiber. The yield is approximately 4.5 g (65%).

$^1$H-NMR (200 MHz, CDCl$_3$) δ ppm: 8.1–8.4 (broad peak, 4H), 7.5–8.0 (two broad peaks 8H), 7.3–7.5 (broad peak, 2H), 2.0–2.4 (broad peak, 4H, H-methylene), 0.8–1.3 (broad peak, 18H), 0.80 (broad peak, 6H, H-methyl), 0.76 (broad peak, 12H, H-methyl), 0.45–0.65 (broad peak, 2H, H-methylidyne).

Example 14

In this example, synthesis of Polymer 4 (D1-73), which illustrates another copolymer with electron-rich and electron-deficient monomeric units, is described. Note that different electron-rich monomeric units are present in this copolymer.

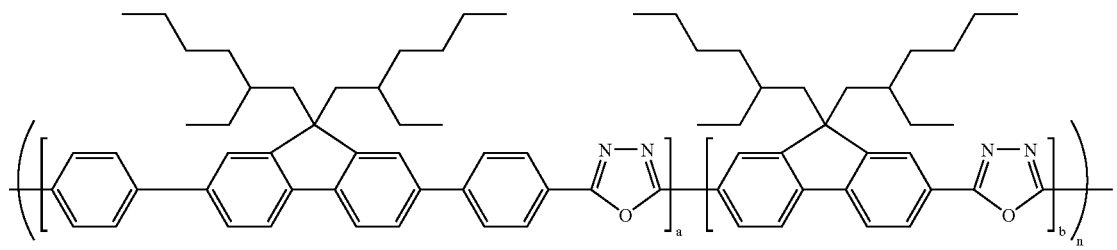

Phosphorus pentoxide (approximately 3.0 g or 21 mmol) can be dissolved in approximately 40 ml of methylsulfuric acid and stirring at approximately 90° C. under nitrogen. A mixture of 9,9-bis(2'-ethylhexyl)-2,7-fluorenedi(p-benzoyl acid) (approximately 500 mg or 0.79 mmol), 9,9-bis(2'-ethylhexyl)-2,7-fluorenedicarboxylic acid (approximately 380 mg or 0.79 mmol) and hydrazine hydrochloride (approximately 110 mg or 1.6 mmol) is added to the solution. The suspension can be stirred for approximately four hours to form a homogenous, viscous solution.

After the solution cools to room temperature, the solution can be poured into approximately 500 ml of water. The polymer may be precipitated and isolated by filtration, washed using water and methanol, and then dried at room temperature in vacuo. The crude polymer may be dissolved in approximately 50 ml of THF. The solution may be filtered through a nominal 5 μm filter, precipitated from approximately one liter of ethanol. The polymer may be isolated, washed using water and methanol, and then vacuum dried at room temperature. This purification process may be repeated two times and produce the polymer as a white fiber. The yield is approximately 0.65 g (75%).

$^1$H-NMR (200 MHz, CDCl$_3$) δ ppm: 8.1–8.4 (broad peak, 8H), 7.75–8.05 (broad peak, 8H), 8.13 7.6–7.75(broad peak, 4H), 2.2–2.5 (br, 8H, H-alkyl), 0.8–1.1 (broad peak, 32H, H-alkyl), 0.5–0.7 (br, 28H, H-alkyl).

Example 15

In this example, synthesis of Polymer 5 (D1-71) (a=99, b=1) is described. In this particular copolymer, approximately 99% of the polymer includes an electron-rich, electron-deficient unit, and approximately one percent includes a fluorophore unit

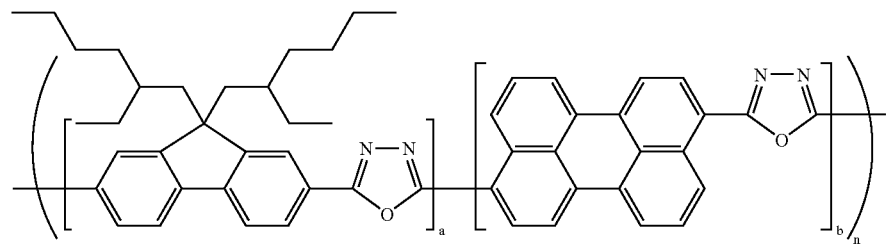

A mixture of 9,9-bis(2'-ethylhexyl)-2,7-fluorenedicarboxylic acid (approximately 1.0 g or 2.1 mmol), of perylene-3,9-dicarboxylic acid (approximately 7.1 mg or 0.021 mmol) and hydrazine hydrochloride (approximately 140 mg or 2.1 mmol) can be formed as a suspension. The remainder of the formation process follows the procedure of Example 14 starting from the point where the suspension is stirred for approximately four hours. The polymer can be a light yellow fiber. The yield can be approximately 0.77 g (80%).

$^1$H-NMR (500 MHz, CDCl$_3$) δ ppm: 8.29 (s, 2H, fluorene ring), 8.23 (d, 2H, J=10 Hz, fluorene ring), 7.98 (d, J=10 Hz, 2H, fluorene ring), 7.1–7.3 (m, H-perylene), 2.1–2.3 (broad peak, 4H, H-methylene), 0.8–1.1 (broad peak, 16H, H-alkyl), 0.50–0.70 (broad peak, 14H, H-alkyl).

Example 16

In this example, synthesis of Polymer 6 (D1-66) (a=20, b=1) is described. In this particular copolymer, approximately 95% of the polymer includes an electron-rich, electron-deficient unit, and approximately five percent includes a fluorophore unit.

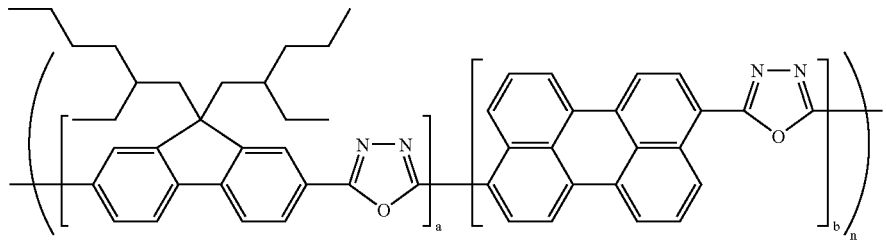

A mixture of 9,9-bis(2'-ethylhexyl)-2,7-fluorenedicarboxylic acid (approximately 1.0 g or 2.1 mmol), of perylene-3,9-dicarboxylic acid (approximately 35 mg or 0.11 mmol) and hydrazine hydrochloride (approximately 150 mg or 2.2 mmol) can be formed as a suspension. The remainder of the formation process follows the procedure of Example 14 starting from the point where the suspension is stirred for approximately four hours. The polymer can be an orange fiber. The yield is approximately 0.72 g (75%).

$^1$H-NMR (500 MHz, CDCl$_3$) δ ppm: 8.3 (s, 2H, fluorene ring), 8.24 (d, 2H, J=6.5 Hz fluorene ring), 7.98 (d, J=8 Hz, 2H, J=8 Hz, fluorene ring), 7.15–7.26 (m, H-perylene), 2.1–2.4 (broad peak, 4H, H-methylene), 0.7–1.1 (broad peak, 16H, H-alkyl), 0.5–0.7 (broad peak, 14H, H-alkyl).

Example 17

In this example, synthesis of Polymer 7 (D1-74) (a=50, b=50, c=1) is described. In this particular copolymer, approximately 99% of the polymer includes two different electron-rich, electron-deficient units, and approximately one percent includes a fluorophore, electron-deficient unit.

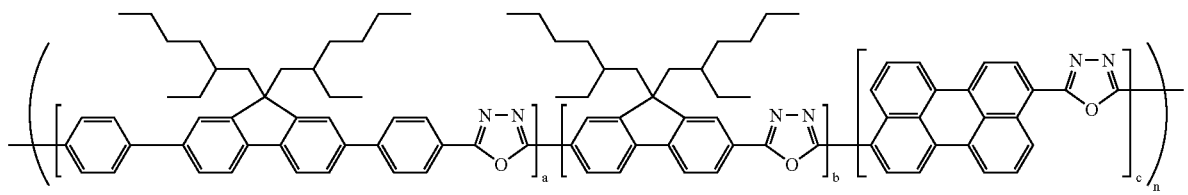

A mixture 9,9-bis(2'-ethylhexyl)-2,7-fluorenedi(p-benzoyl acid) (approximately 500 mg or 0.79 mmol), 9,9-bis(2'-ethylhexyl)-2,7-fluorenedicarboxylic acid (approximately 380 mg or 0.79 mmol), perylene-3,9-dicarboxylic acid (approximately 5.4 mg or 0.016 mmol) and hydrazine hydrochloride (approximately 110 mg or 1.6 mmol) can be formed as a suspension. The remainder of the formation process follows the procedure of Example 14 starting from the point where the suspension is stirred for approximately four hours. The polymer can be a light yellow fiber. The yield is approximately 0.67 g (77%).

$^1$H-NMR (500 MHz, CDCl$_3$) δ ppm: 8.28 (broad peak, 6H), 8.23 (d, 2H, J=6 Hz), 7.98 (d, 2H J=6 Hz), 7.85(broad peak, 6H), 7.68 (broad peak, 4H), 7.1–7.3 (m, H-perylene), 2.1–2.3 (broad peak, 8H, H-methylene), 0.7–1.1 (broad peak, 32H, H-alkyl), 0.5–0.7 (broad peak, 28H, H-alkyl).

Example 18

In this example, synthesis of Polymer 8 (D1-75) (a=10, b=10, c=1) is described. In this particular copolymer, approximately 95% of the polymer includes two different electron-rich, electron-deficient units, and approximately five percent includes a fluorophore unit.

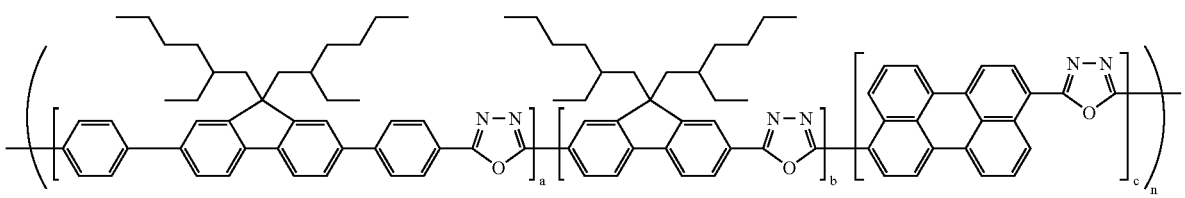

A mixture 9,9-bis(2'-ethylhexyl)-2,7-fluorenedi(p-benzoyl acid) (approximately 500 mg or 0.79 mmol), 9,9-bis(2'-ethylhexyl)-2,7-fluorenedicarboxylic acid (approximately 380 mg or 0.79 mmol), perylene-3,9-dicarboxylic acid (approximately 26 mg or 0.076 mmol) and hydrazine hydrochloride (approximately 110 mg or 1.7 mmol) can be formed as a suspension. The remainder of the formation process follows the procedure of Example 14 starting from the point where the suspension is stirred for approximately four hours. The polymer can be a light yellow fiber. The yield can be approximately 0.72 g (82%).

$^1$H-NMR (500 MHz, CDCl$_3$) δ ppm: 8.28 (broad peak, 6H), 8.23 (d, 2H, J=6 Hz), 7.98 (d, 2H J=6 Hz), 7.85(broad peak, 6H), 7.68 (broad peak, 4H), 7.1–7.3 (m, H-perylene), 2.1–2.3 (broad peak, 8H, H-methylene), 0.7–1.1 (broad peak, 32H, H-alkyl), 0.5–0.7 (broad peak, 28H, H-alkyl).

Example 19

In this example, synthesis of Polymer 9 (D1-99) (a=100, b=100, c=1) is described. In this particular copolymer, approximately 99.5% of the polymer includes two different electron-rich, electron-deficient units, and approximately 0.5 percent includes a fluorophore unit.

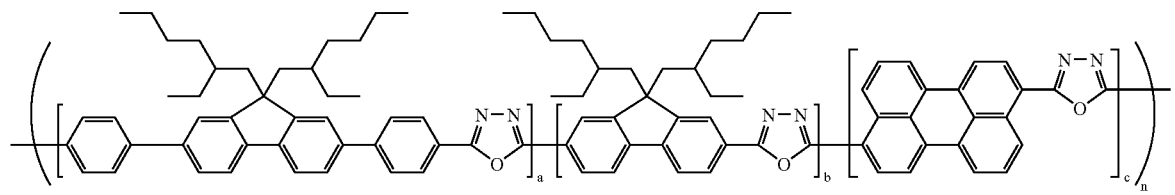

A mixture 9,9-bis(2'-ethylhexyl)-2,7-fluorenedi(p-benzoyl acid) (approximately 1000 mg or 1.6 mmol), 9,9-bis(2'-ethylhexyl)-2,7-fluorenedicarboxylic acid (approximately 760 mg or 1.6 mmol), perylene-3, 9-dicarboxylic acid (approximately 5.4 mg or 0.016 mmol) and hydrazine hydrochloride (approximately 220 mg or 3.2 mmol) can be formed as a suspension. The remainder of the formation process follows the procedure of Example 14 starting from the point where the suspension is stirred for approximately four hours. The polymer can be a light yellow fiber. The yield is approximately 1.4 g (79%).

$^1$H-NMR (500 MHz, CDCl$_3$) δ ppm: 8.28 (broad peak, 6H), 8.23 (d, 2H, J=6 Hz), 7.98 (d, 2H J=6 Hz), 7.85(broad peak, 6H), 7.69 (broad peak, 4H), 7.1–7.3 (m, H-perylene), 2.1–2.3 (broad peak, 8H, H-methylene), 0.7–1.1 (broad peak, 32H, H-alkyl), 0.5–0.7 (broad peak, 28H, H-alkyl).

Analysis of Polymer Examples (Examples 11–19)

GPC analysis can be conducted with an Acuflow Series III Pump equipped with a refractive index detector. HPLC-grade THF may be used as the mobile phase, and a column bank consisting of four Phenomenex Phenogel columns (size approximately 300×7.8 mm, nominal pore widths $10^4$ nm, $10^3$ nm, $10^2$ nm, and 50 nm) as the stationary phase. A constant flow rate of approximately 1 mL/minute is maintained, and the instrument may be calibrated with polystyrene standards from Scientific Polymer Products, Inc. (Ontario, N.Y.). In Table 1 below, B/O/P is the polymer content (B=benzene; O=oxadiazole; P=perylene).

TABLE 1

Polymer Data From GCP Analysis

| Polymer | Color of EL emission | B/O/P | $M_w$ ($10^5$) | $M_n$ ($10^5$) | PD Index |
|---|---|---|---|---|---|
| Polymer 1 | Blue | 2/1/0 | 1.39 | 0.66 | 2.11 |
| Polymer 2 | Blue | 3/1/0 | 2.37 | 1.15 | 2.05 |
| Polymer 3 | Blue | 4/1/0 | 7.67 | 2.40 | 3.18 |
| Polymer 4 | Blue | 3/1/0 | 11.5 | 2.97 | 3.86 |
| Polymer 5 | Green | 2/1/0.01 | 1.34 | 0.63 | 2.14 |
| Polymer 6 | Orange | 2/1/0.05 | 0.93 | 0.40 | 2.30 |
| Polymer 7 | Green | 3/1/0.01 | 10.0 | 2.01 | 4.98 |
| Polymer 8 | Orange | 3/1/0.05 | 11.5 | 5.74 | 2.00 |
| Polymer 9 | Green | 3/1/0.005 | 2.01 | 0.82 | 2.44 |

For the polymers in Table 1, blue can be emitted when no perylene (fluorophore monomeric unit) is present. When the perylene content is approximately 0.13–0.32% of the other monomeric units, green light is emitted. When the perylene content is approximately 1.3–1.6% of the other monomeric units, orange light is emitted. Other colors may be achieved, and actual concentrations for other copolymers may depend on the electron-rich, electron-deficient, and fluorophore monomeric units. After reading this specification, skilled artisans will be able to select materials that best suit their specific needs.

Figure 3:
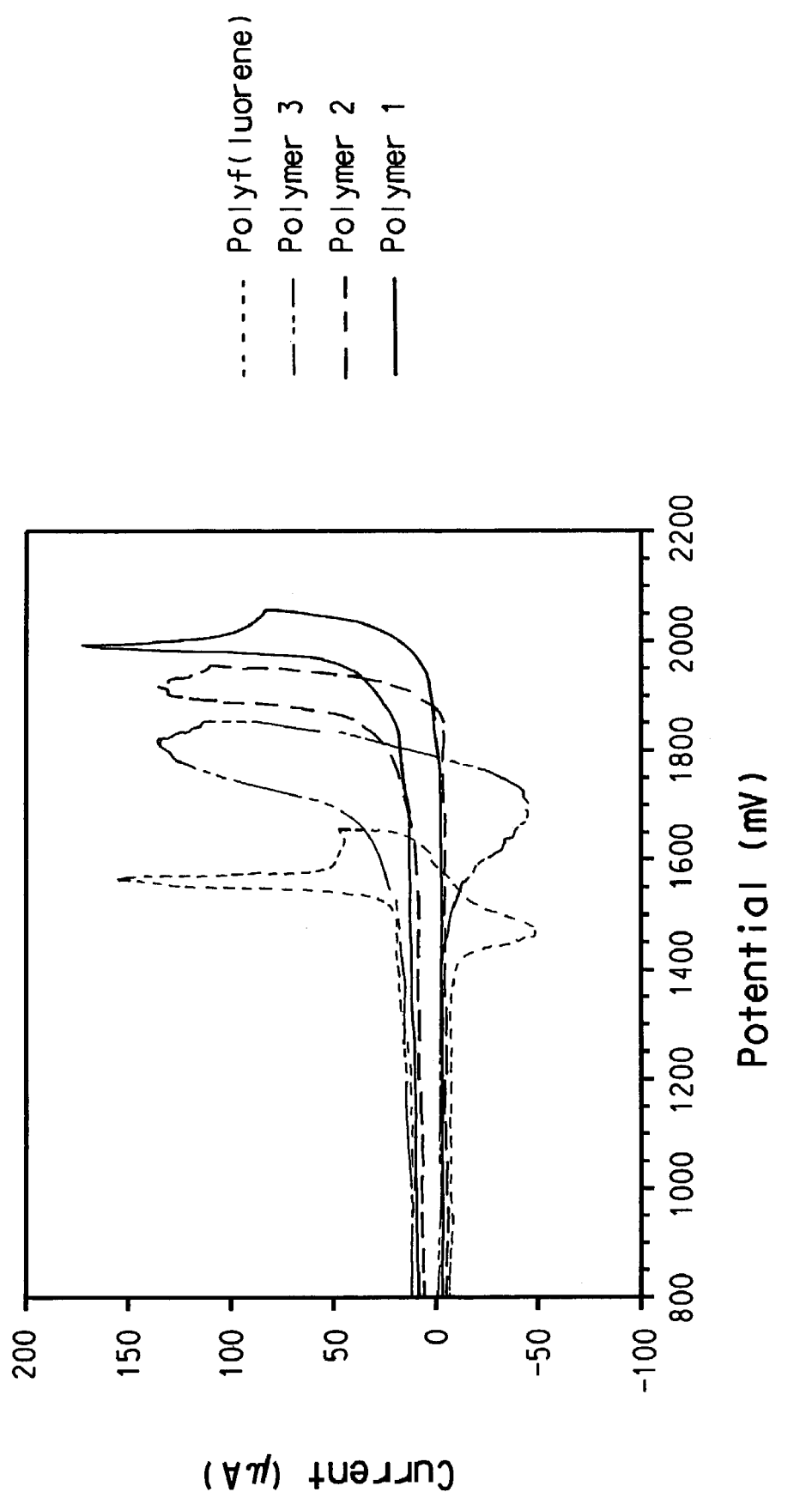
FIG. 3 includes a plot of cyclic voltammetry measurements for a set of copolymers.

Cyclic voltammetry measurements can be carried out on BAS 100A electrochemical analyzer available from Bio Analytical Systems. A silver wire may be used as a quasi-reference electrode, and a platinum wire as auxiliary electrode and glossy carbon as a working electrode. The polymer can be first disolved in THF or chloroform and dropcast a film on top of working elctrode. All measurements may be carried out in nominal 0.1 M tetra(n-butyl)ammonium hexafluorophosphate ("TBA PF6") in acetonitrile and at a potential rate of approximately 50 mV/s at ambient environment at room temperature. FIG. 3 includes a plot of the cyclic voltammetry of some of the polymers. Therefore, the HOMO level of the EL polymer is determined by the oxidation potential from cyclic voltammetry.

Light-emitting diodes can be fabricated as electronic devices similar to those shown in FIG. 1. The LEDs can comprise Polymer 1-Polymer 9 as the active layer 130. For each polymer, five-finger devices can be fabricated. Barium or aluminum may be used as cathode. PEDOT (Baytron P 4083 from Bayer) or PVK (Aldrich) may be used as anode buffers (layer 120). Four different device architectures are listed below. EL signifies the electroluminescent or active layer 130.

ITO/PEDOT/EL/Ba
ITO/PVK/EL/Ba
ITO/PEDOT/EL/Al
ITO/PVK/EL/Al

On top of the ITO, a thin layer (nominal 200 nm) of PEDOT or PVK may be spin-coated and used as the anode layer 110 and the hole injection/transport layer 120. Thickness of the active layer 130 is approximately 70 nm for all the devices. The thickness can be measured using a surface profiler (Alpha-Step 500 Surface Profiler available from KLA-Tencor Corp.).

Barium or aluminum can be use the cathode. The metal cathode film is fabricated on top of the active layer 130 using vacuum vapor deposition at pressures below approximately $1\times10^{-6}$ Torr yielding LEDs, where each cathode of the LEDs has an effective area of approximately 0.15 cm$^2$. The cathode area defines active area of devices. The deposition speed and the thickness of the barium or aluminum layer can be monitored with a STM-100 thickness/rate meter(Sycon Instruments, Inc.). For devices using barium as the cathode layer 130, substantially immediately after deposition of barium layer, approximately 500 nm of an aluminum capping layer is deposited on the top of barium layer. Therefore, layer 140 can comprise barium, and layer 150 can comprise aluminum. When only aluminum is used for the cathode, layer 140 may not be present within the electronic device. Finally, the devices can be packaged using a simple glass cover fixed with an UV curing epoxy resin using a conventional technique.

For each of the devices, the current versus voltage curve, the light intensity versus voltage curve, and the quantum efficiency can be measured. The external quantum efficiency, QE(EL)ext, can be measured in an integrating sphere and luminance can be measured using a calibrated photodiode and UDT S370 optometer.

Table 2 includes data for electronic devices with different combinations of materials used for the active layer 130 ("EL polymer" and its composition expressed in "B/O/P", where B=benzene; O=oxadiazole; and P=perylene) and materials in direct contact with the active layer 130 on the anode and cathode sides of the active layer 130.

TABLE 2

Device structure and electrical performance.

| ID | EL Polymer | B/O/P | anode | cathode | V | mA | cd/m2 | QE(%) |
|---|---|---|---|---|---|---|---|---|
| GS-11 | Polymer 1 | 2/1/0 | PVK | Ba | 8 |  | 23.4 | 1.6 |
| J-60 | Polymer 1 | 2/1/0 | PEDOT | Ba | 8 |  | 1.45 | 0.006 |
| B35 | Polymer 3 | 4/1/0 | PEDOT | Ba | 14 | 36.6 | 71 | 0.049 |
| B67 | Polymer 3 | 4/1/0 | PVK | Ba | 14 | 16.4 | 75 | 0.18 |
| B25 | Polymer 4 | 3/1/0 | PEDOT | Ba | 14 | 9.79 | 14 | 0.055 |
| B57 | Polymer 4 | 3/1/0 | PVK | Ba | 16 | 10.4 | 312 | 1.16 |
| B23 | Polymer 5 | 2/1/0.01 | PEDOT | Ba | 20 | 19.1 | 164 | 0.11 |
| B55 | Polymer 5 | 2/1/0.01 | PVK | Ba | 26 | 1.38 | 109 | 1.01 |
| B21 | Polymer 6 | 2/1/0.05 | PEDOT | Ba | 18 | 13.0 | 106 | 0.11 |
| B53 | Polymer 6 | 2/1/0.05 | PVK | Ba | 20 | 5.78 | 317 | 0.75 |
| B27 | Polymer 7 | 3/1/0.01 | PEDOT | Ba | 16 | 16.4 | 304 | 0.24 |
| B59 | Polymer 7 | 3/1/0.01 | PVK | Ba | 24 | 100 | 4882 | 0.61 |
| B29 | Polymer 8 | 3/1/0.05 | PEDOT | Ba | 18 | 31.8 | 104 | 0.048 |
| B61 | Polymer 8 | 3/1/0.05 | PVK | Ba | 20 | 21.0 | 692 | 0.50 |
| B31 | Polymer 9 | 3/1/0.005 | PEDOT | Ba | 16 | 13.7 | 365 | 0.33 |
| B63 | Polymer 9 | 3/1/0.005 | PVK | Ba | 18 | 18.5 | 4508 | 3.14 |
| B33 | Polymer 10 | 3.3/1/0 | PEDOT | Ba | 12 | 17.3 | 24 | 0.053 |
| B65 | Polymer 10 | 3.3/1/0 | PVK | Ba | 16 | 11.0 | 203 | 0.70 |
| B36 | Polymer 3 | 4/1/0 | PEDOT | Al | 20 | 16.5 | 2.4 | 0.006 |
| B68 | Polymer 3 | 4/1/0 | PVK | Al | 24 | 1.73 | 4.5 | 0.01 |
| B26 | Polymer 4 | 3/1/0 | PEDOT | Al | 26 | 6.72 | 2.0 | 0.011 |
| B58 | Polymer 4 | 3/1/0 | PVK | Al | 26 | 8.91 | 106 | 0.47 |
| B24 | Polymer 5 | 2/1/0.01 | PEDOT | Al | 16 | 19.7 | 2.3 | .002 |
| B56 | Polymer 5 | 2/1/0.01 | PVK | Al | 26 | 10.9 | 839 | 1.02 |
| B22 | Polymer 6 | 2/1/0.05 | PEDOT | Al | 16 | 32.8 | 10 | 0.007 |
| B54 | Polymer 6 | 2/1/0.05 | PVK | Al | 22 | 8.67 | 353 | 1.0 |
| B28 | Polymer 7 | 3/1/0.01 | PEDOT | Al | 26 | 81.7 | 269 | 0.044 |
| B60 | Polymer 7 | 3/1/0.01 | PVK | Al | 22 | 9.09 | 802 | 1.16 |
| B30 | Polymer 8 | 3/1/0.05 | PEDOT | Al | 20 | 12.3 | 19 | 0.03 |
| B62 | Polymer 8 | 3/1/0.05 | PVK | Al | 20 | 6.33 | 133 | 0.45 |
| B32 | Polymer 9 | 3/1/0.005 | PEDOT | Al | 22 | 5.62 | 24.8 | 0.058 |
| B64 | Polymer 9 | 3/1/0.005 | PVK | Al | 24 | 6.94 | 673 | 1.28 |

Figure 4:
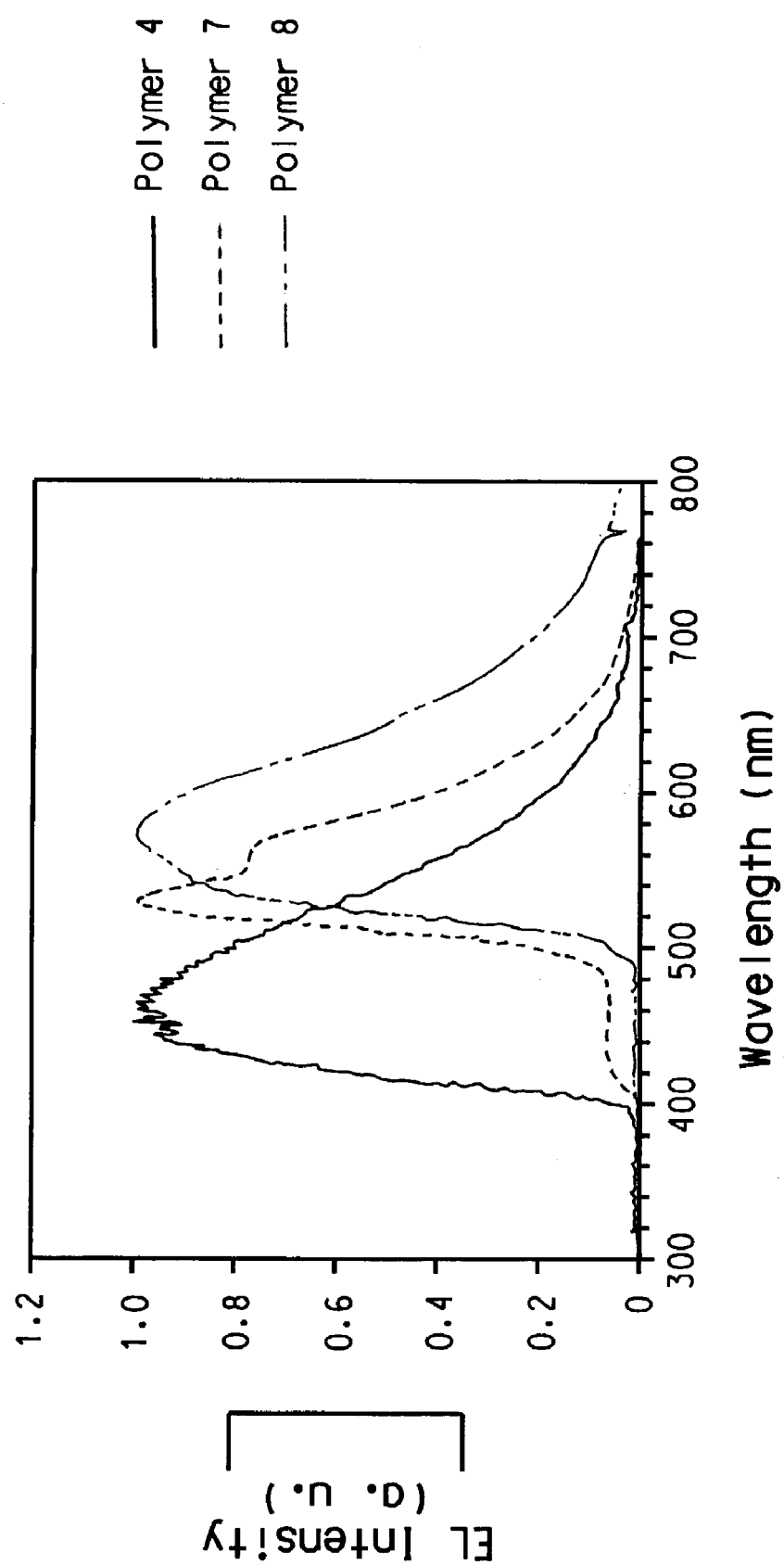
FIG. 4 includes a plot of electroluminescence spectra for some of the copolymers.
Figure 5:
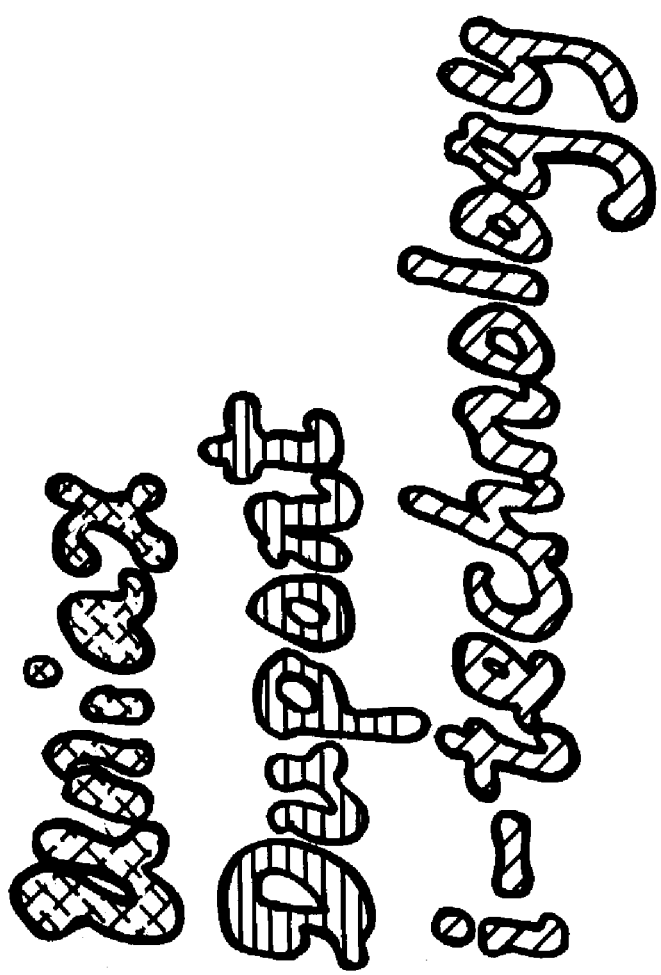
FIG. 5 includes a photoluminescence image of different copolymers that emit different colors of light.

FIG. 4 includes an electroluminescence spectra of Polymers 4, 7, and 8. The spectra show that the color of emission of the active layer 130 can be tuned from blue to orange. FIG. 5 includes a photoluminescence image of Polymer 4 ("Uniax"—orange color), Polymer 7 ("DuPont"—blue color), and Polymer 8 ("i-technology"—green color) to further illustrate that color of emission of the active layer 130 can be tuned from blue to orange region. Nearly any color within the visible light spectrum (approximately 400–700 nm) may be obtained.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A copolymer comprising:

a first monomeric unit comprising an electron-rich group;

a second monomeric unit comprising an electron-deficient group; and a fluorophore monomeric unit wherein, within the copolymer, a number of the fluorophore monomeric unit comprises no more than approximately five percent of a sum of a number of the first and second monomeric units, wherein the fluorophore monomeric unit comprises a dye having a molecular structure selected from:

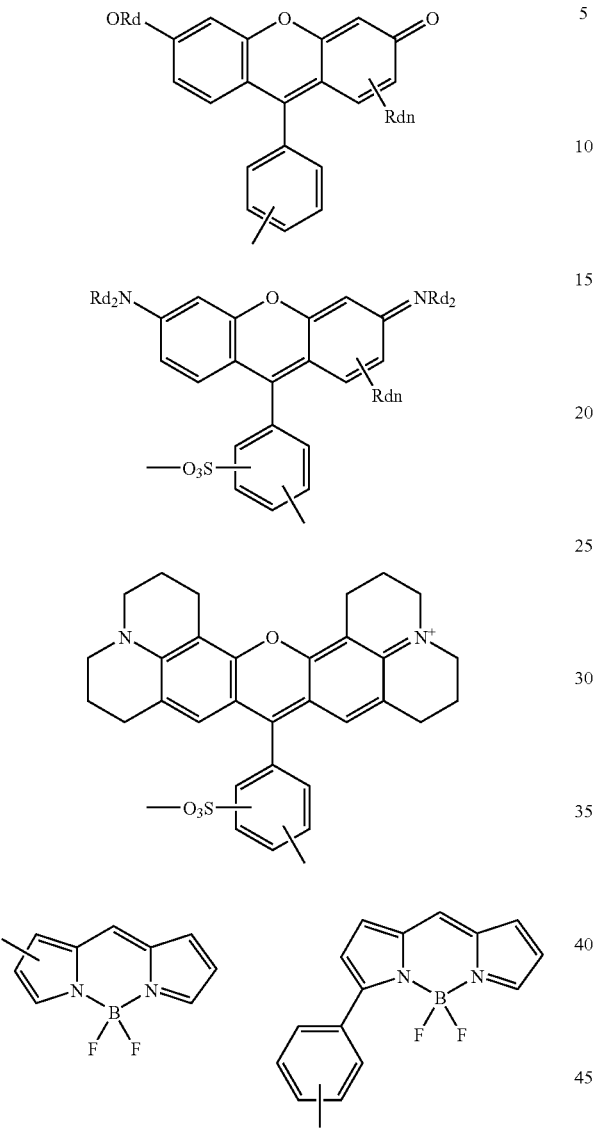

wherein:
Rd can be the same or different at each occurrence and is selected from hydrogen, halogen, alkyl, alkoxy, and alkylamino groups;
n is a number of potential sites in a corresponding aromatic group capable of substitution by Rd; and
the dye may be selected from a combination of the above aromatic groups connected by a single bond, ethenyl or ethynyl group.

2. An electronic device comprising an active layer comprising the copolymer of claim 1.

3. The electronic device of claim 2, wherein the electronic device comprises a display.

4. The electronic device of claim 2, wherein the electronic device is capable of emitting light within the visible light spectrum.

5. A copolymer comprising a first monomeric unit, a second monomeric unit, and a fluorophore monomeric unit, wherein:
the first monomeric unit is selected from:

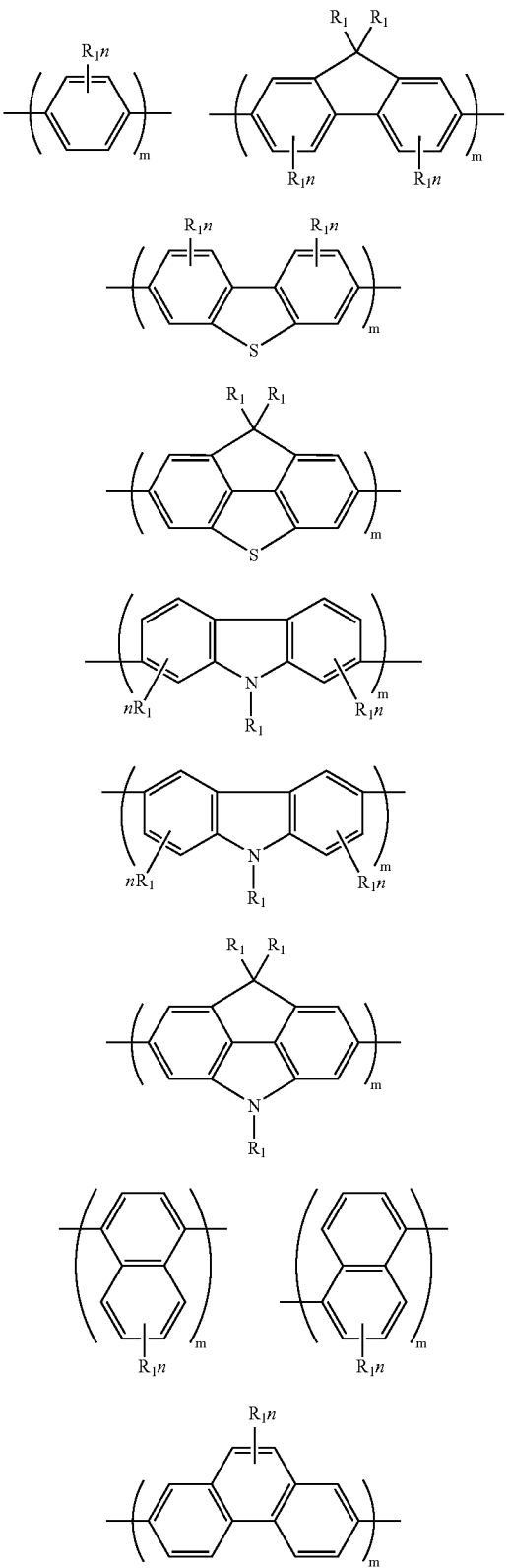

-continued

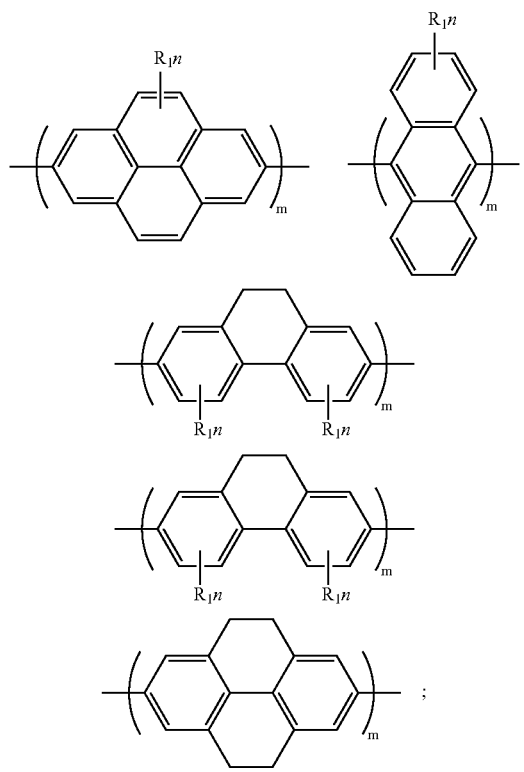

the second monomeric unit is selected from:

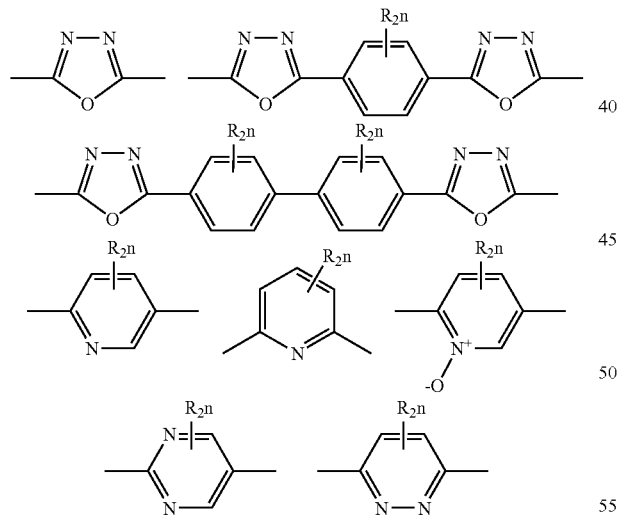

wherein:
R1 can be the same or different at each occurrence and is selected from hydrogen, alkyl, and alkyl derivative groups;
the alkyl derivative group comprises an alkyl group where one or more —CH$_2$— units are replaced by a moiety selected from —O—, —S—, C$_{2-14}$ aryl, and —NR'—, wherein R' comprises a C$_{1-100}$ saturated hydrocarbon group;

R2 can be the same or different at each occurrence and is selected from hydrogen, alkyl, fluoro, cyano, nitro, trifluoromethyl, and sulfo groups;
n is a number of potential sites in a corresponding aromatic group capable of substitution by R1 or R2;
m is from 1 to 10;
wherein each of the first and second monomeric units may be selected from a combination of the above aromatic groups connected by a single bond, ethenyl or ethynyl group, and
wherein the fluorophore monomeric unit comprises a perylene group and an oxadiazole ring.

6. A copolymer comprising a first monomeric unit, a second monomeric unit, and a fluorophore monomeric unit, wherein:
the first monomeric unit is selected from:

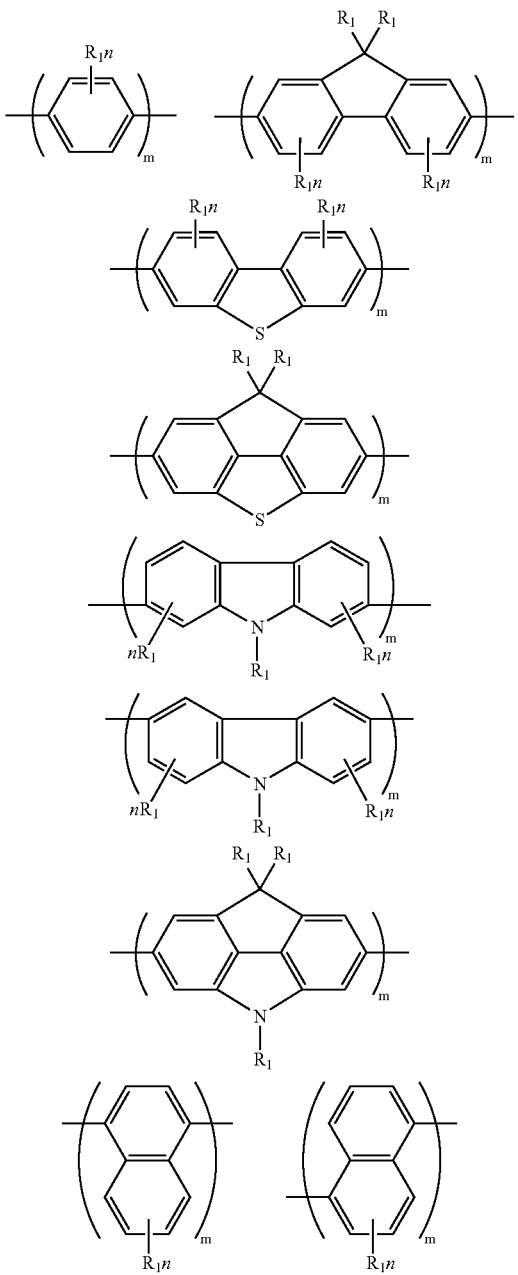

-continued

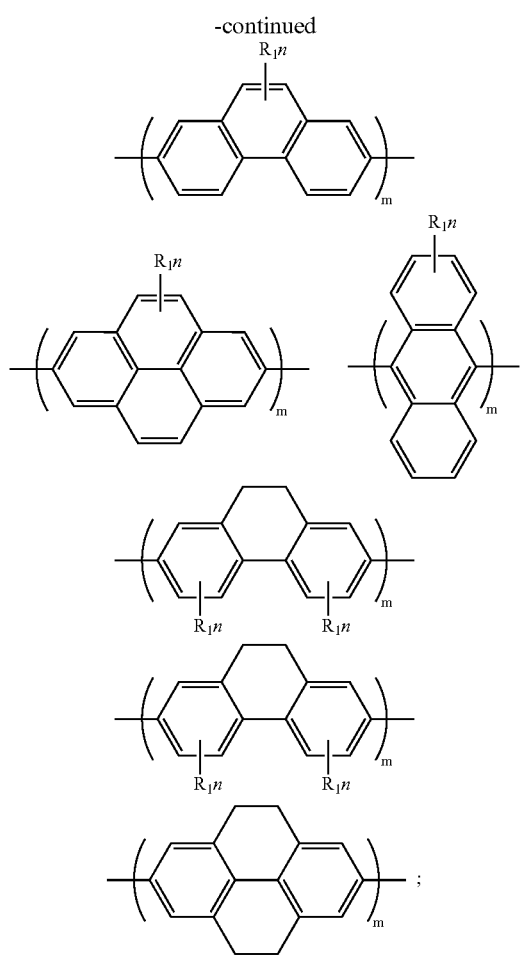

the second monomeric unit is selected from:

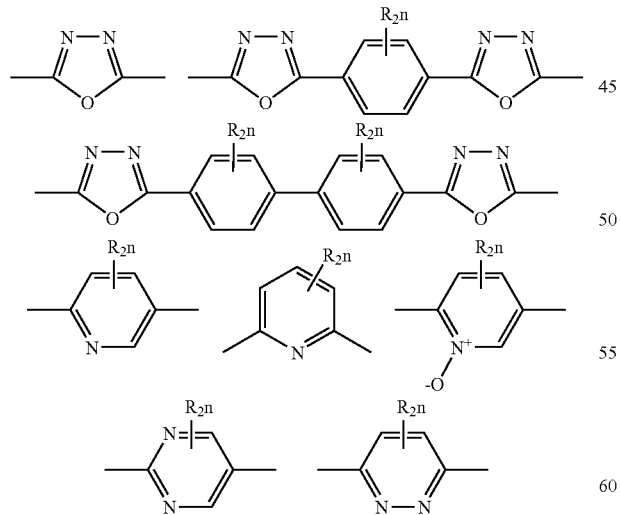

wherein:

R1 can be the same or different at each occurrence and is selected from hydrogen, alkyl, and alkyl derivative groups;

the alkyl derivative group comprises an alkyl group where one or more —CH$_2$— units are replaced by a moiety selected from —O—, —S—, C$_{2-14}$ aryl, and —NR'—, wherein R' comprises a C$_{1-100}$ saturated hydrocarbon group;

R2 can be the same or different at each occurrence and is selected from hydrogen, alkyl, fluoro, cyano, nitro, trifluoromethyl, and sulfo groups;

n is a number of potential sites in a corresponding aromatic group capable of substitution by R1 or R2;

m is from 1 to 10;

wherein each of the first and second monomeric units may be selected from a combination of the above aromatic groups connected by a single bond, ethenyl or ethynyl group, and wherein the fluorophore monomeric unit comprises a dye having a molecular structure selected from:

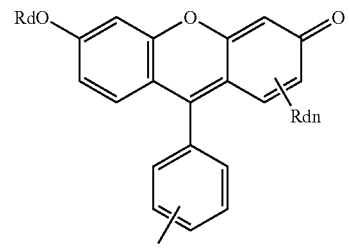

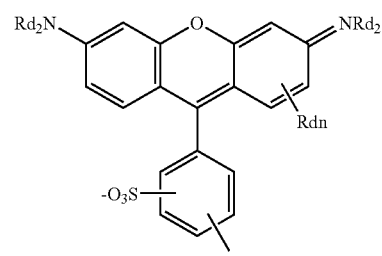

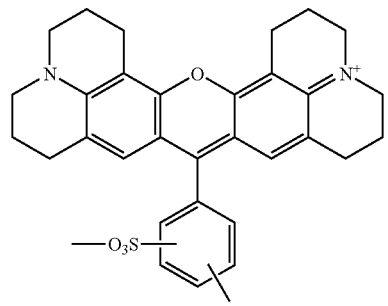

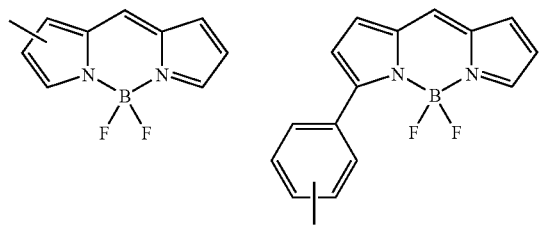

wherein:

Rd can be the same or different at each occurrence and is selected from hydrogen, halogen, alkyl, alkoxy, and alkylamino groups;

n is a number of potential sites in a corresponding aromatic group capable of substitution by Rd; and the dye may be selected from a combination of the above aromatic groups connected by a single bond, ethenyl or ethynyl group.

7. An electronic device comprising an active layer comprising the copolymer of claim 5 or 6.

8. The electronic device of claim 7, wherein the electronic device comprises a display.

9. The electranic device of claim 7, wherein the electronic device is capable of emitting light within the visible light spectrum.

\* \* \* \* \*